United States Patent
Simon (10) Patent No.: US 9,072,171 B2
(45) Date of Patent: Jun. 30, 2015

(54) CIRCUIT BOARD MOUNT FOR LED LIGHT

(75) Inventor: David L. Simon, Grosse Pointe Woods, MI (US)

(73) Assignee: iLumisys, Inc., Troy, MI (US)

( * ) Notice: Subject to any disclaimer, the term of this patent is extended or adjusted under 35 U.S.C. 154(b) by 0 days.

(21) Appl. No.: 13/593,994

(22) Filed: Aug. 24, 2012

(65) Prior Publication Data

US 2013/0050999 A1 Feb. 28, 2013

Related U.S. Application Data (60) Provisional application No. 61/526,875, filed on Aug. 24, 2011.

(51) Int. Cl.
| | |
|---|---|
| *F21V 7/20* | (2006.01) |
| *H05K 3/00* | (2006.01) |
| *F21K 99/00* | (2010.01) |
| *F21V 19/00* | (2006.01) |
| *H05K 1/02* | (2006.01) |
| *F21Y 101/02* | (2006.01) |
| *F21Y 103/00* | (2006.01) |

(52) U.S. Cl.
CPC ........... *H05K 3/0061* (2013.01); *Y10T 29/4913* (2015.01); *H05K 1/0203* (2013.01); *H05K 2201/10106* (2013.01); *F21K 9/17* (2013.01); *F21V 19/005* (2013.01); *F21Y 2101/02* (2013.01); *F21Y 2103/003* (2013.01)

(58) Field of Classification Search
USPC ...................... 362/218, 249.01, 249.02, 217.1
See application file for complete search history.

(56) References Cited

U.S. PATENT DOCUMENTS

| | | |
|---|---|---|
| D54,511 S | 2/1920 | Owen |
| D58,105 S | 6/1921 | Poritz |
| D79,814 S | 11/1929 | Hoch |
| D80,419 S | 1/1930 | Kramer |
| D84,763 S | 7/1931 | Stange |
| D119,797 S | 4/1940 | Winkler et al. |
| D125,312 S | 2/1941 | Logan |
| 2,826,679 A | 3/1958 | Irmischer et al. |
| 2,909,097 A | 10/1959 | Eugene et al. |
| 3,272,977 A | 9/1966 | Holmes |

(Continued)

FOREIGN PATENT DOCUMENTS

| | | |
|---|---|---|
| CN | 1584388 A | 2/2005 |
| CN | 2766345 Y | 3/2006 |

(Continued)

OTHER PUBLICATIONS

Notification of Transmittal, the International Search Report and the Written Opinion of the International Searching Authority dated May 7, 2012 from the corresponding International Application No. PCT/US2011/058312.

(Continued)

*Primary Examiner* — Evan Dzierzynski
(74) *Attorney, Agent, or Firm* — Young Basile (57) ABSTRACT

An LED-based light for replacing a conventional fluorescent light in an existing fixture is disclosed. The LED-based light includes an elongated housing, a heat sink extending substantially the length of the housing and having at least one integral retaining portion and a circuit board positioned on the heat sink and having a plurality of LEDs mounted thereon, wherein the at least one integral retaining portion is configured to secure the circuit board to the heat sink.

20 Claims, 2 Drawing Sheets

(56) References Cited

U.S. PATENT DOCUMENTS

| | | |
|---|---|---|
| 3,318,185 A | 5/1967 | Hermann |
| 3,561,719 A | 2/1971 | Grindle |
| 3,586,936 A | 6/1971 | McLeroy |
| 3,601,621 A | 8/1971 | Ritchie |
| 3,612,855 A | 10/1971 | Juhnke |
| 3,643,088 A | 2/1972 | Osteen et al. |
| 3,739,336 A | 6/1973 | Burland |
| 3,746,918 A | 7/1973 | Drucker et al. |
| 3,818,216 A | 6/1974 | Larraburu |
| 3,832,503 A | 8/1974 | Crane |
| 3,858,086 A | 12/1974 | Anderson et al. |
| 3,909,670 A | 9/1975 | Wakamatsu et al. |
| 3,924,120 A | 12/1975 | Cox, III |
| 3,958,885 A | 5/1976 | Stockinger et al. |
| 3,974,637 A | 8/1976 | Bergey et al. |
| 3,993,386 A | 11/1976 | Rowe |
| 4,001,571 A | 1/1977 | Martin |
| 4,054,814 A | 10/1977 | Fegley et al. |
| 4,070,568 A | 1/1978 | Gala |
| 4,082,395 A | 4/1978 | Donato et al. |
| 4,096,349 A | 6/1978 | Donato |
| 4,102,558 A | 7/1978 | Krachman |
| 4,107,581 A | 8/1978 | Abernethy |
| 4,189,663 A | 2/1980 | Schmutzer et al. |
| 4,211,955 A | 7/1980 | Ray |
| 4,241,295 A | 12/1980 | Williams, Jr. |
| 4,261,029 A | 4/1981 | Mousset |
| 4,262,255 A | 4/1981 | Kokei et al. |
| 4,271,408 A | 6/1981 | Teshima et al. |
| 4,271,458 A | 6/1981 | George, Jr. |
| 4,272,689 A | 6/1981 | Crosby et al. |
| 4,273,999 A | 6/1981 | Pierpoint |
| 4,298,869 A | 11/1981 | Okuno |
| 4,329,625 A | 5/1982 | Nishizawa et al. |
| 4,339,788 A | 7/1982 | White et al. |
| 4,342,947 A | 8/1982 | Bloyd |
| 4,344,117 A | 8/1982 | Niccum |
| 4,367,464 A | 1/1983 | Kurahashi et al. |
| D268,134 S | 3/1983 | Zurcher |
| 4,382,272 A | 5/1983 | Quella et al. |
| 4,388,567 A | 6/1983 | Yamazaki et al. |
| 4,388,589 A | 6/1983 | Molldrem, Jr. |
| 4,392,187 A | 7/1983 | Bornhorst |
| 4,394,719 A | 7/1983 | Moberg |
| 4,420,711 A | 12/1983 | Takahashi et al. |
| 4,455,562 A | 6/1984 | Dolan et al. |
| 4,500,796 A | 2/1985 | Quin |
| 4,521,835 A | 6/1985 | Meggs et al. |
| 4,581,687 A | 4/1986 | Nakanishi |
| 4,597,033 A | 6/1986 | Meggs et al. |
| 4,600,972 A | 7/1986 | MacIntyre |
| 4,607,317 A | 8/1986 | Lin |
| 4,622,881 A | 11/1986 | Rand |
| 4,625,152 A | 11/1986 | Nakai |
| 4,635,052 A | 1/1987 | Aoike et al. |
| 4,647,217 A | 3/1987 | Havel |
| 4,656,398 A | 4/1987 | Michael et al. |
| 4,661,890 A | 4/1987 | Watanabe et al. |
| 4,668,895 A | 5/1987 | Schneiter |
| 4,669,033 A | 5/1987 | Lee |
| 4,675,575 A | 6/1987 | Smith et al. |
| 4,682,079 A | 7/1987 | Sanders et al. |
| 4,686,425 A | 8/1987 | Havel |
| 4,687,340 A | 8/1987 | Havel |
| 4,688,154 A | 8/1987 | Nilssen |
| 4,688,869 A | 8/1987 | Kelly |
| 4,695,769 A | 9/1987 | Schweickardt |
| 4,698,730 A | 10/1987 | Sakai et al. |
| 4,701,669 A | 10/1987 | Head et al. |
| 4,705,406 A | 11/1987 | Havel |
| 4,707,141 A | 11/1987 | Havel |
| D293,723 S | 1/1988 | Buttner |
| 4,727,289 A | 2/1988 | Uchida |
| 4,739,454 A | 4/1988 | Federgreen |
| 4,740,882 A | 4/1988 | Miller |
| 4,748,545 A | 5/1988 | Schmitt |
| 4,753,148 A | 6/1988 | Johnson |
| 4,758,173 A | 7/1988 | Northrop |
| 4,765,708 A | 8/1988 | Becker et al. |
| 4,771,274 A | 9/1988 | Havel |
| 4,780,621 A | 10/1988 | Bartleucci et al. |
| 4,794,373 A | 12/1988 | Harrison |
| 4,794,383 A | 12/1988 | Havel |
| 4,810,937 A | 3/1989 | Havel |
| 4,818,072 A | 4/1989 | Mohebban |
| 4,824,269 A | 4/1989 | Havel |
| 4,837,565 A | 6/1989 | White |
| 4,843,627 A | 6/1989 | Stebbins |
| 4,845,481 A | 7/1989 | Havel |
| 4,845,745 A | 7/1989 | Havel |
| 4,851,972 A | 7/1989 | Altman |
| 4,854,701 A | 8/1989 | Noll et al. |
| 4,857,801 A | 8/1989 | Farrell |
| 4,863,223 A | 9/1989 | Weissenbach et al. |
| 4,870,325 A | 9/1989 | Kazar |
| 4,874,320 A | 10/1989 | Freed et al. |
| 4,887,074 A | 12/1989 | Simon et al. |
| 4,894,832 A | 1/1990 | Colak |
| 4,901,207 A | 2/1990 | Sato et al. |
| 4,904,988 A | 2/1990 | Nesbit et al. |
| 4,912,371 A | 3/1990 | Hamilton |
| 4,922,154 A | 5/1990 | Cacoub |
| 4,929,936 A | 5/1990 | Friedman et al. |
| 4,934,852 A | 6/1990 | Havel |
| 4,941,072 A | 7/1990 | Yasumoto et al. |
| 4,943,900 A | 7/1990 | Gartner |
| 4,962,687 A | 10/1990 | Belliveau et al. |
| 4,965,561 A | 10/1990 | Havel |
| 4,973,835 A | 11/1990 | Kurosu et al. |
| 4,977,351 A | 12/1990 | Bavaro et al. |
| 4,979,081 A | 12/1990 | Leach et al. |
| 4,979,180 A | 12/1990 | Muncheryan |
| 4,980,806 A | 12/1990 | Taylor et al. |
| 4,991,070 A | 2/1991 | Stob |
| 4,992,704 A | 2/1991 | Stinson |
| 5,003,227 A | 3/1991 | Nilssen |
| 5,008,595 A | 4/1991 | Kazar |
| 5,008,788 A | 4/1991 | Palinkas |
| 5,010,459 A | 4/1991 | Taylor et al. |
| 5,018,054 A | 5/1991 | Ohashi et al. |
| 5,027,037 A | 6/1991 | Wei |
| 5,027,262 A | 6/1991 | Freed |
| 5,032,960 A | 7/1991 | Katoh |
| 5,034,807 A | 7/1991 | Von Kohorn |
| 5,036,248 A | 7/1991 | McEwan et al. |
| 5,038,255 A | 8/1991 | Nishihashi et al. |
| 5,065,226 A | 11/1991 | Kluitmans et al. |
| 5,072,216 A | 12/1991 | Grange |
| 5,078,039 A | 1/1992 | Tulk et al. |
| 5,083,063 A | 1/1992 | Brooks |
| 5,088,013 A | 2/1992 | Revis |
| 5,089,748 A | 2/1992 | Ihms |
| 5,103,382 A | 4/1992 | Kondo et al. |
| 5,122,733 A | 6/1992 | Havel |
| 5,126,634 A | 6/1992 | Johnson |
| 5,128,595 A | 7/1992 | Hara |
| 5,130,909 A | 7/1992 | Gross |
| 5,134,387 A | 7/1992 | Smith et al. |
| 5,136,483 A | 8/1992 | Schoniger et al. |
| 5,140,220 A | 8/1992 | Hasegawa |
| 5,142,199 A | 8/1992 | Elwell |
| 5,151,679 A | 9/1992 | Dimmick |
| 5,154,641 A | 10/1992 | McLaughlin |
| 5,161,879 A | 11/1992 | McDermott |
| 5,161,882 A | 11/1992 | Garrett |
| 5,164,715 A | 11/1992 | Kashiwabara et al. |
| 5,184,114 A | 2/1993 | Brown |
| 5,194,854 A | 3/1993 | Havel |
| 5,198,756 A | 3/1993 | Jenkins et al. |
| 5,209,560 A | 5/1993 | Taylor et al. |
| 5,220,250 A | 6/1993 | Szuba |
| 5,225,765 A | 7/1993 | Callahan et al. |
| 5,226,723 A | 7/1993 | Chen |
| 5,254,910 A | 10/1993 | Yang |

(56) References Cited

U.S. PATENT DOCUMENTS

| | | |
|---|---|---|
| 5,256,948 A | 10/1993 | Boldin et al. |
| 5,278,542 A | 1/1994 | Smith et al. |
| 5,282,121 A | 1/1994 | Bornhorst et al. |
| 5,283,517 A | 2/1994 | Havel |
| 5,287,352 A | 2/1994 | Jackson et al. |
| 5,294,865 A | 3/1994 | Haraden |
| 5,298,871 A | 3/1994 | Shimohara |
| 5,301,090 A | 4/1994 | Hed |
| 5,303,124 A | 4/1994 | Wrobel |
| 5,307,295 A | 4/1994 | Taylor et al. |
| 5,321,593 A | 6/1994 | Moates |
| 5,323,226 A | 6/1994 | Schreder |
| 5,329,431 A | 7/1994 | Taylor et al. |
| 5,344,068 A | 9/1994 | Haessig |
| 5,350,977 A | 9/1994 | Hamamoto et al. |
| 5,357,170 A | 10/1994 | Luchaco et al. |
| 5,365,411 A | 11/1994 | Rycroft et al. |
| 5,371,618 A | 12/1994 | Tai et al. |
| 5,374,876 A | 12/1994 | Horibata et al. |
| 5,375,043 A | 12/1994 | Tokunaga |
| D354,360 S | 1/1995 | Murata |
| 5,381,074 A | 1/1995 | Rudzewicz et al. |
| 5,388,357 A | 2/1995 | Malita |
| 5,402,702 A | 4/1995 | Hata |
| 5,404,094 A | 4/1995 | Green et al. |
| 5,404,282 A | 4/1995 | Klinke et al. |
| 5,406,176 A | 4/1995 | Sugden |
| 5,410,328 A | 4/1995 | Yoksza et al. |
| 5,412,284 A | 5/1995 | Moore et al. |
| 5,412,552 A | 5/1995 | Fernandes |
| 5,420,482 A | 5/1995 | Phares |
| 5,421,059 A | 6/1995 | Leffers, Jr. |
| 5,430,356 A | 7/1995 | Ference et al. |
| 5,432,408 A | 7/1995 | Matsuda et al. |
| 5,436,535 A | 7/1995 | Yang |
| 5,436,853 A | 7/1995 | Shimohara |
| 5,450,301 A | 9/1995 | Waltz et al. |
| 5,461,188 A | 10/1995 | Drago et al. |
| 5,463,280 A | 10/1995 | Johnson |
| 5,463,502 A | 10/1995 | Savage, Jr. |
| 5,465,144 A | 11/1995 | Parker et al. |
| 5,473,522 A | 12/1995 | Kriz et al. |
| 5,475,300 A | 12/1995 | Havel |
| 5,481,441 A | 1/1996 | Stevens |
| 5,489,827 A | 2/1996 | Xia |
| 5,491,402 A | 2/1996 | Small |
| 5,493,183 A | 2/1996 | Kimball |
| 5,504,395 A | 4/1996 | Johnson et al. |
| 5,506,760 A | 4/1996 | Giebler et al. |
| 5,513,082 A | 4/1996 | Asano |
| 5,519,496 A | 5/1996 | Borgert et al. |
| 5,530,322 A | 6/1996 | Ference et al. |
| 5,544,809 A | 8/1996 | Keating et al. |
| 5,545,950 A | 8/1996 | Cho |
| 5,550,440 A | 8/1996 | Allison et al. |
| 5,559,681 A | 9/1996 | Duarte |
| 5,561,346 A | 10/1996 | Byrne |
| D376,030 S | 11/1996 | Cohen |
| 5,575,459 A | 11/1996 | Anderson |
| 5,575,554 A | 11/1996 | Guritz |
| 5,581,158 A | 12/1996 | Quazi |
| 5,592,051 A | 1/1997 | Korkala |
| 5,592,054 A | 1/1997 | Nerone et al. |
| 5,600,199 A | 2/1997 | Martin, Sr. et al. |
| 5,607,227 A | 3/1997 | Yasumoto et al. |
| 5,608,290 A | 3/1997 | Hutchisson et al. |
| 5,614,788 A | 3/1997 | Mullins et al. |
| 5,621,282 A | 4/1997 | Haskell |
| 5,621,603 A | 4/1997 | Adamec et al. |
| 5,621,662 A | 4/1997 | Humphries et al. |
| 5,622,423 A | 4/1997 | Lee |
| 5,633,629 A | 5/1997 | Hochstein |
| 5,634,711 A | 6/1997 | Kennedy et al. |
| 5,640,061 A | 6/1997 | Bornhorst et al. |
| 5,640,141 A | 6/1997 | Myllymaki |
| 5,642,129 A | 6/1997 | Zavracky et al. |
| 5,655,830 A | 8/1997 | Ruskouski |
| 5,656,935 A | 8/1997 | Havel |
| 5,661,374 A | 8/1997 | Cassidy et al. |
| 5,661,645 A | 8/1997 | Hochstein |
| 5,673,059 A | 9/1997 | Zavracky et al. |
| 5,682,103 A | 10/1997 | Burrell |
| 5,684,523 A | 11/1997 | Satoh et al. |
| 5,688,042 A | 11/1997 | Madadi et al. |
| 5,697,695 A | 12/1997 | Lin et al. |
| 5,701,058 A | 12/1997 | Roth |
| 5,712,650 A | 1/1998 | Barlow |
| 5,721,471 A | 2/1998 | Begemann et al. |
| 5,725,148 A | 3/1998 | Hartman |
| 5,726,535 A | 3/1998 | Yan |
| 5,731,759 A | 3/1998 | Finucan |
| 5,734,590 A | 3/1998 | Tebbe |
| 5,751,118 A | 5/1998 | Mortimer |
| 5,752,766 A | 5/1998 | Bailey et al. |
| 5,765,940 A | 6/1998 | Levy et al. |
| 5,769,527 A | 6/1998 | Taylor et al. |
| 5,784,006 A | 7/1998 | Hochstein |
| 5,785,227 A | 7/1998 | Akiba |
| 5,790,329 A | 8/1998 | Klaus et al. |
| 5,803,579 A | 9/1998 | Turnbull et al. |
| 5,803,580 A | 9/1998 | Tseng |
| 5,803,729 A | 9/1998 | Tsimerman |
| 5,806,965 A | 9/1998 | Deese |
| 5,808,689 A | 9/1998 | Small |
| 5,810,463 A | 9/1998 | Kawahara et al. |
| 5,812,105 A | 9/1998 | Van de Ven |
| 5,813,751 A | 9/1998 | Shaffer |
| 5,813,753 A | 9/1998 | Vriens et al. |
| 5,821,695 A | 10/1998 | Vilanilam et al. |
| 5,825,051 A | 10/1998 | Bauer et al. |
| 5,828,178 A | 10/1998 | York et al. |
| 5,836,676 A | 11/1998 | Ando et al. |
| 5,848,837 A | 12/1998 | Gustafson |
| 5,850,126 A | 12/1998 | Kanbar |
| 5,851,063 A | 12/1998 | Doughty et al. |
| 5,852,658 A | 12/1998 | Knight et al. |
| 5,854,542 A | 12/1998 | Forbes |
| RE36,030 E | 1/1999 | Nadeau |
| 5,859,508 A | 1/1999 | Ge et al. |
| 5,865,529 A | 2/1999 | Yan |
| 5,890,794 A | 4/1999 | Abtahi et al. |
| 5,896,010 A | 4/1999 | Mikolajczak et al. |
| 5,904,415 A | 5/1999 | Robertson et al. |
| 5,907,742 A | 5/1999 | Johnson et al. |
| 5,909,378 A | 6/1999 | De Milleville |
| 5,912,653 A | 6/1999 | Fitch |
| 5,917,287 A | 6/1999 | Haederle et al. |
| 5,917,534 A | 6/1999 | Rajeswaran |
| 5,921,660 A | 7/1999 | Yu |
| 5,924,784 A | 7/1999 | Chliwnyj et al. |
| 5,927,845 A | 7/1999 | Gustafson et al. |
| 5,934,792 A | 8/1999 | Camarota |
| 5,936,599 A | 8/1999 | Reymond |
| 5,943,802 A | 8/1999 | Tijanic |
| 5,946,209 A | 8/1999 | Eckel et al. |
| 5,949,347 A | 9/1999 | Wu |
| 5,951,145 A | 9/1999 | Iwasaki et al. |
| 5,952,680 A | 9/1999 | Strite |
| 5,959,547 A | 9/1999 | Tubel et al. |
| 5,961,072 A | 10/1999 | Bodle |
| 5,962,989 A | 10/1999 | Baker |
| 5,962,992 A | 10/1999 | Huang et al. |
| 5,963,185 A | 10/1999 | Havel |
| 5,974,553 A | 10/1999 | Gandar |
| 5,980,064 A | 11/1999 | Metroyanis |
| 5,998,925 A | 12/1999 | Shimizu et al. |
| 5,998,928 A | 12/1999 | Hipp |
| 6,007,209 A | 12/1999 | Pelka |
| 6,008,783 A | 12/1999 | Kitagawa et al. |
| 6,011,691 A | 1/2000 | Schreffler |
| 6,016,038 A | 1/2000 | Mueller et al. |
| 6,018,237 A | 1/2000 | Havel |
| 6,019,493 A | 2/2000 | Kuo et al. |
| 6,020,825 A | 2/2000 | Chansky et al. |

(56) References Cited

U.S. PATENT DOCUMENTS

| | | | |
|---|---|---|---|
| 6,025,550 A | 2/2000 | Kato |
| 6,028,694 A | 2/2000 | Schmidt |
| 6,030,099 A | 2/2000 | McDermott |
| 6,031,343 A | 2/2000 | Recknagel et al. |
| D422,737 S | 4/2000 | Orozco |
| 6,056,420 A | 5/2000 | Wilson et al. |
| 6,068,383 A | 5/2000 | Robertson et al. |
| 6,069,597 A | 5/2000 | Hansen |
| 6,072,280 A | 6/2000 | Allen |
| 6,074,074 A * | 6/2000 | Marcus ........................ 362/240 |
| 6,084,359 A | 7/2000 | Hetzel et al. |
| 6,086,220 A | 7/2000 | Lash et al. |
| 6,091,200 A | 7/2000 | Lenz |
| 6,092,915 A | 7/2000 | Rensch |
| 6,095,661 A | 8/2000 | Lebens et al. |
| 6,097,352 A | 8/2000 | Zavracky et al. |
| 6,116,748 A | 9/2000 | George |
| 6,121,875 A | 9/2000 | Hamm et al. |
| 6,127,783 A | 10/2000 | Pashley et al. |
| 6,132,072 A | 10/2000 | Turnbull et al. |
| 6,135,604 A | 10/2000 | Lin |
| 6,135,620 A | 10/2000 | Marsh |
| 6,139,174 A | 10/2000 | Butterworth |
| 6,149,283 A | 11/2000 | Conway et al. |
| 6,150,774 A | 11/2000 | Mueller et al. |
| 6,151,529 A | 11/2000 | Batko |
| 6,153,985 A | 11/2000 | Grossman |
| 6,158,882 A | 12/2000 | Bischoff, Jr. |
| 6,166,496 A | 12/2000 | Lys et al. |
| 6,175,201 B1 | 1/2001 | Sid |
| 6,175,220 B1 | 1/2001 | Billig et al. |
| 6,181,126 B1 | 1/2001 | Havel |
| D437,947 S | 2/2001 | Huang |
| 6,183,086 B1 | 2/2001 | Neubert |
| 6,183,104 B1 | 2/2001 | Ferrara |
| 6,184,628 B1 | 2/2001 | Ruthenberg |
| 6,196,471 B1 | 3/2001 | Ruthenberg |
| 6,203,180 B1 | 3/2001 | Fleischmann |
| 6,211,626 B1 | 4/2001 | Lys et al. |
| 6,215,409 B1 | 4/2001 | Blach |
| 6,217,190 B1 | 4/2001 | Altman et al. |
| 6,219,239 B1 | 4/2001 | Mellberg et al. |
| 6,227,679 B1 | 5/2001 | Zhang et al. |
| 6,238,075 B1 | 5/2001 | Dealey, Jr. et al. |
| 6,241,359 B1 | 6/2001 | Lin |
| 6,250,774 B1 | 6/2001 | Begemann et al. |
| 6,252,350 B1 | 6/2001 | Alvarez |
| 6,252,358 B1 | 6/2001 | Xydis et al. |
| 6,268,600 B1 | 7/2001 | Nakamura et al. |
| 6,273,338 B1 | 8/2001 | White |
| 6,275,397 B1 | 8/2001 | McClain |
| 6,283,612 B1 | 9/2001 | Hunter |
| 6,292,901 B1 | 9/2001 | Lys et al. |
| 6,293,684 B1 | 9/2001 | Riblett |
| 6,297,724 B1 | 10/2001 | Bryans et al. |
| 6,305,109 B1 | 10/2001 | Lee |
| 6,305,821 B1 | 10/2001 | Hsieh et al. |
| 6,307,331 B1 | 10/2001 | Bonasia et al. |
| 6,310,590 B1 | 10/2001 | Havel |
| 6,315,429 B1 | 11/2001 | Grandolfo |
| 6,323,832 B1 | 11/2001 | Nishizawa et al. |
| 6,325,651 B1 | 12/2001 | Nishihara et al. |
| 6,334,699 B1 | 1/2002 | Gladnick |
| 6,340,868 B1 | 1/2002 | Lys et al. |
| 6,354,714 B1 | 3/2002 | Rhodes |
| 6,361,186 B1 | 3/2002 | Slayden |
| 6,362,578 B1 | 3/2002 | Swanson et al. |
| 6,369,525 B1 | 4/2002 | Chang et al. |
| 6,371,637 B1 | 4/2002 | Atchinson et al. |
| 6,373,733 B1 | 4/2002 | Wu et al. |
| 6,379,022 B1 | 4/2002 | Amerson et al. |
| D457,667 S | 5/2002 | Piepgras et al. |
| D457,669 S | 5/2002 | Piepgras et al. |
| D457,974 S | 5/2002 | Piepgras et al. |
| 6,388,393 B1 | 5/2002 | Illingworth |
| 6,394,623 B1 | 5/2002 | Tsui |
| 6,396,216 B1 | 5/2002 | Noone et al. |
| D458,395 S | 6/2002 | Piepgras et al. |
| 6,400,096 B1 | 6/2002 | Wells et al. |
| 6,404,131 B1 | 6/2002 | Kawano et al. |
| 6,411,022 B1 | 6/2002 | Machida |
| 6,411,045 B1 | 6/2002 | Nerone |
| 6,422,716 B2 | 7/2002 | Henrici et al. |
| 6,428,189 B1 | 8/2002 | Hochstein |
| 6,429,604 B1 | 8/2002 | Chang |
| D463,610 S | 9/2002 | Piepgras et al. |
| 6,445,139 B1 | 9/2002 | Marshall et al. |
| 6,448,550 B1 | 9/2002 | Nishimura |
| 6,448,716 B1 | 9/2002 | Hutchison |
| 6,459,919 B1 | 10/2002 | Lys et al. |
| 6,469,457 B2 | 10/2002 | Callahan |
| 6,471,388 B1 | 10/2002 | Marsh |
| 6,472,823 B2 | 10/2002 | Yen |
| 6,473,002 B1 | 10/2002 | Hutchison |
| D468,035 S | 12/2002 | Blanc et al. |
| 6,488,392 B1 | 12/2002 | Lu |
| 6,495,964 B1 | 12/2002 | Muthu et al. |
| 6,511,204 B2 | 1/2003 | Emmel et al. |
| 6,517,218 B2 | 2/2003 | Hochstein |
| 6,521,879 B1 | 2/2003 | Rand et al. |
| 6,527,411 B1 | 3/2003 | Sayers |
| 6,528,954 B1 | 3/2003 | Lys et al. |
| 6,528,958 B2 | 3/2003 | Hulshof et al. |
| 6,538,375 B1 | 3/2003 | Duggal et al. |
| 6,540,381 B1 | 4/2003 | Douglass, II |
| 6,541,800 B2 | 4/2003 | Barnett et al. |
| 6,548,967 B1 | 4/2003 | Dowling et al. |
| 6,568,834 B1 | 5/2003 | Scianna |
| 6,573,536 B1 | 6/2003 | Dry |
| 6,577,072 B2 | 6/2003 | Saito et al. |
| 6,577,080 B2 | 6/2003 | Lys et al. |
| 6,577,512 B2 | 6/2003 | Tripathi et al. |
| 6,577,794 B1 | 6/2003 | Currie et al. |
| 6,578,979 B2 | 6/2003 | Truttmann-Battig |
| 6,582,103 B1 | 6/2003 | Popovich et al. |
| 6,583,550 B2 | 6/2003 | Iwasa et al. |
| 6,583,573 B2 | 6/2003 | Bierman |
| 6,585,393 B1 | 7/2003 | Brandes et al. |
| 6,586,890 B2 | 7/2003 | Min et al. |
| 6,590,343 B2 | 7/2003 | Pederson |
| 6,592,238 B2 | 7/2003 | Cleaver et al. |
| 6,594,369 B1 * | 7/2003 | Une ........................ 381/174 |
| 6,596,977 B2 | 7/2003 | Muthu et al. |
| 6,598,996 B1 | 7/2003 | Lodhie |
| 6,608,453 B2 | 8/2003 | Morgan et al. |
| 6,608,614 B1 | 8/2003 | Johnson |
| 6,609,804 B2 | 8/2003 | Nolan et al. |
| 6,612,712 B2 | 9/2003 | Nepil |
| 6,612,717 B2 | 9/2003 | Yen |
| 6,612,729 B1 | 9/2003 | Hoffman |
| 6,621,222 B1 | 9/2003 | Hong |
| 6,623,151 B2 | 9/2003 | Pederson |
| 6,624,597 B2 | 9/2003 | Dowling et al. |
| D481,484 S | 10/2003 | Cuevas et al. |
| 6,634,770 B2 | 10/2003 | Cao |
| 6,634,779 B2 | 10/2003 | Reed |
| 6,636,003 B2 | 10/2003 | Rahm et al. |
| 6,639,349 B1 | 10/2003 | Bahadur |
| 6,641,284 B2 | 11/2003 | Stopa et al. |
| 6,652,117 B2 | 11/2003 | Tsai |
| 6,659,622 B2 | 12/2003 | Katogi et al. |
| 6,660,935 B2 | 12/2003 | Southard et al. |
| 6,666,689 B1 | 12/2003 | Savage, Jr. |
| 6,667,623 B2 | 12/2003 | Bourgault et al. |
| 6,674,096 B2 | 1/2004 | Sommers |
| 6,676,284 B1 | 1/2004 | Wynne Willson |
| 6,679,621 B2 | 1/2004 | West et al. |
| 6,681,154 B2 | 1/2004 | Nierlich et al. |
| 6,682,205 B2 | 1/2004 | Lin |
| 6,683,419 B2 | 1/2004 | Kriparos |
| 6,700,136 B2 | 3/2004 | Guida |
| 6,712,486 B1 | 3/2004 | Popovich et al. |
| 6,717,376 B2 | 4/2004 | Lys et al. |
| 6,717,526 B2 | 4/2004 | Martineau et al. |

(56) References Cited

U.S. PATENT DOCUMENTS

| | | |
|---|---|---|
| 6,720,745 B2 | 4/2004 | Lys et al. |
| 6,726,348 B2 | 4/2004 | Gloisten |
| 6,736,525 B2 | 5/2004 | Chin |
| 6,741,324 B1 | 5/2004 | Kim |
| D491,678 S | 6/2004 | Piepgras |
| D492,042 S | 6/2004 | Piepgras |
| 6,744,223 B2 | 6/2004 | Laflamme et al. |
| 6,748,299 B1 | 6/2004 | Motoyama |
| 6,762,562 B2 | 7/2004 | Leong |
| 6,768,047 B2 | 7/2004 | Chang et al. |
| 6,774,584 B2 | 8/2004 | Lys et al. |
| 6,777,891 B2 | 8/2004 | Lys et al. |
| 6,781,329 B2 | 8/2004 | Mueller et al. |
| 6,787,999 B2 | 9/2004 | Stimac et al. |
| 6,788,000 B2 | 9/2004 | Appelberg et al. |
| 6,788,011 B2 | 9/2004 | Mueller et al. |
| 6,791,840 B2 | 9/2004 | Chun |
| 6,796,680 B1 | 9/2004 | Showers et al. |
| 6,799,864 B2 | 10/2004 | Bohler et al. |
| 6,801,003 B2 | 10/2004 | Schanberger et al. |
| 6,803,732 B2 | 10/2004 | Kraus et al. |
| 6,806,659 B1 | 10/2004 | Mueller et al. |
| 6,814,470 B2 | 11/2004 | Rizkin et al. |
| 6,814,478 B2 | 11/2004 | Menke |
| 6,815,724 B2 | 11/2004 | Dry |
| 6,846,094 B2 | 1/2005 | Luk |
| 6,851,816 B2 | 2/2005 | Wu et al. |
| 6,851,832 B2 | 2/2005 | Tieszen |
| 6,853,150 B2 | 2/2005 | Clauberg et al. |
| 6,853,151 B2 | 2/2005 | Leong et al. |
| 6,853,563 B1 | 2/2005 | Yang et al. |
| 6,857,924 B2 | 2/2005 | Fu et al. |
| 6,860,628 B2 | 3/2005 | Robertson et al. |
| 6,866,401 B2 | 3/2005 | Sommers et al. |
| 6,869,204 B2 | 3/2005 | Morgan et al. |
| 6,871,981 B2 | 3/2005 | Alexanderson et al. |
| 6,874,924 B1 | 4/2005 | Hulse et al. |
| 6,879,883 B1 | 4/2005 | Motoyama |
| 6,882,111 B2 | 4/2005 | Kan et al. |
| 6,883,929 B2 | 4/2005 | Dowling |
| 6,883,934 B2 | 4/2005 | Kawakami et al. |
| 6,888,322 B2 | 5/2005 | Dowling et al. |
| 6,897,624 B2 | 5/2005 | Lys et al. |
| D506,274 S | 6/2005 | Moriyama et al. |
| 6,909,239 B2 | 6/2005 | Gauna |
| 6,909,921 B1 | 6/2005 | Bilger |
| 6,918,680 B2 | 7/2005 | Seeberger |
| 6,921,181 B2 | 7/2005 | Yen |
| 6,926,419 B2 | 8/2005 | An |
| 6,936,968 B2 | 8/2005 | Cross et al. |
| 6,936,978 B2 | 8/2005 | Morgan et al. |
| 6,940,230 B2 | 9/2005 | Myron et al. |
| 6,948,829 B2 | 9/2005 | Verdes et al. |
| 6,953,261 B2 | 10/2005 | Jiao et al. |
| 6,957,905 B1 | 10/2005 | Pritchard et al. |
| 6,963,175 B2 | 11/2005 | Archenhold et al. |
| 6,964,501 B2 | 11/2005 | Ryan |
| 6,965,197 B2 | 11/2005 | Tyan et al. |
| 6,965,205 B2 | 11/2005 | Piepgras et al. |
| 6,967,448 B2 | 11/2005 | Morgan et al. |
| 6,969,179 B2 | 11/2005 | Sloan et al. |
| 6,969,186 B2 | 11/2005 | Sonderegger et al. |
| 6,969,954 B2 | 11/2005 | Lys |
| 6,975,079 B2 | 12/2005 | Lys et al. |
| 6,979,097 B2 | 12/2005 | Elam et al. |
| 6,982,518 B2 | 1/2006 | Chou et al. |
| 6,995,681 B2 | 2/2006 | Pederson |
| 6,997,576 B1 | 2/2006 | Lodhie et al. |
| 6,999,318 B2 | 2/2006 | Newby |
| 7,004,603 B2 | 2/2006 | Knight |
| D518,218 S | 3/2006 | Roberge et al. |
| 7,008,079 B2 | 3/2006 | Smith |
| 7,014,336 B1 | 3/2006 | Ducharme et al. |
| 7,015,650 B2 | 3/2006 | McGrath |
| 7,018,063 B2 | 3/2006 | Michael et al. |
| 7,018,074 B2 | 3/2006 | Raby et al. |
| 7,021,799 B2 | 4/2006 | Mizuyoshi |
| 7,021,809 B2 | 4/2006 | Iwasa et al. |
| 7,024,256 B2 | 4/2006 | Krzyzanowski et al. |
| 7,029,145 B2 | 4/2006 | Frederick |
| 7,031,920 B2 | 4/2006 | Dowling et al. |
| 7,033,036 B2 | 4/2006 | Pederson |
| 7,038,398 B1 | 5/2006 | Lys et al. |
| 7,038,399 B2 | 5/2006 | Lys et al. |
| 7,042,172 B2 | 5/2006 | Dowling et al. |
| 7,048,423 B2 | 5/2006 | Stepanenko et al. |
| 7,049,761 B2 | 5/2006 | Timmermans et al. |
| 7,052,171 B1 | 5/2006 | Lefebvre et al. |
| 7,053,557 B2 | 5/2006 | Cross et al. |
| 7,064,498 B2 | 6/2006 | Dowling et al. |
| 7,064,674 B2 | 6/2006 | Pederson |
| 7,067,992 B2 | 6/2006 | Leong et al. |
| 7,077,978 B2 | 7/2006 | Setlur et al. |
| 7,080,927 B2 | 7/2006 | Feuerborn et al. |
| 7,086,747 B2 | 8/2006 | Nielson et al. |
| 7,088,014 B2 | 8/2006 | Nierlich et al. |
| 7,088,904 B2 | 8/2006 | Ryan, Jr. |
| 7,102,902 B1 | 9/2006 | Brown et al. |
| 7,113,541 B1 | 9/2006 | Lys et al. |
| 7,114,830 B2 | 10/2006 | Robertson et al. |
| 7,114,834 B2 | 10/2006 | Rivas et al. |
| 7,118,262 B2 | 10/2006 | Negley |
| 7,119,503 B2 | 10/2006 | Kemper |
| 7,120,560 B2 | 10/2006 | Williams et al. |
| 7,121,679 B2 | 10/2006 | Fujimoto |
| 7,122,976 B1 | 10/2006 | Null et al. |
| 7,128,442 B2 | 10/2006 | Lee et al. |
| 7,128,454 B2 | 10/2006 | Kim et al. |
| D532,532 S | 11/2006 | Maxik |
| 7,132,635 B2 | 11/2006 | Dowling |
| 7,132,785 B2 | 11/2006 | Ducharme |
| 7,132,804 B2 | 11/2006 | Lys et al. |
| 7,135,824 B2 | 11/2006 | Lys et al. |
| 7,139,617 B1 | 11/2006 | Morgan et al. |
| 7,144,135 B2 | 12/2006 | Martin et al. |
| 7,153,002 B2 | 12/2006 | Kim et al. |
| 7,161,311 B2 | 1/2007 | Mueller et al. |
| 7,161,313 B2 | 1/2007 | Piepgras et al. |
| 7,161,556 B2 | 1/2007 | Morgan et al. |
| 7,164,110 B2 | 1/2007 | Pitigoi-Aron et al. |
| 7,164,235 B2 | 1/2007 | Ito et al. |
| 7,165,863 B1 | 1/2007 | Thomas et al. |
| 7,165,866 B2 | 1/2007 | Li |
| 7,167,777 B2 | 1/2007 | Budike, Jr. |
| 7,168,843 B2 | 1/2007 | Striebel |
| D536,468 S | 2/2007 | Crosby |
| 7,178,941 B2 | 2/2007 | Roberge et al. |
| 7,180,252 B2 | 2/2007 | Lys et al. |
| D538,950 S | 3/2007 | Maxik |
| D538,952 S | 3/2007 | Maxik et al. |
| D538,962 S | 3/2007 | Elliott |
| 7,186,003 B2 | 3/2007 | Dowling et al. |
| 7,186,005 B2 | 3/2007 | Hulse |
| 7,187,141 B2 | 3/2007 | Mueller et al. |
| 7,190,126 B1 | 3/2007 | Paton |
| 7,192,154 B2 | 3/2007 | Becker |
| 7,198,387 B1 | 4/2007 | Gloisten et al. |
| 7,201,491 B2 | 4/2007 | Bayat et al. |
| 7,201,497 B2 | 4/2007 | Weaver, Jr. et al. |
| 7,202,613 B2 | 4/2007 | Morgan et al. |
| 7,204,615 B2 | 4/2007 | Arik et al. |
| 7,204,622 B2 | 4/2007 | Dowling et al. |
| 7,207,696 B1 | 4/2007 | Lin |
| 7,210,818 B2 | 5/2007 | Luk et al. |
| 7,210,957 B2 | 5/2007 | Mrakovich et al. |
| 7,211,959 B1 | 5/2007 | Chou |
| 7,213,934 B2 | 5/2007 | Zarian et al. |
| 7,217,004 B2 | 5/2007 | Park et al. |
| 7,217,012 B2 | 5/2007 | Southard et al. |
| 7,217,022 B2 | 5/2007 | Ruffin |
| 7,218,056 B1 | 5/2007 | Harwood |
| 7,218,238 B2 | 5/2007 | Right et al. |
| 7,220,015 B2 | 5/2007 | Dowling |
| 7,220,018 B2 | 5/2007 | Crabb et al. |

(56) References Cited

U.S. PATENT DOCUMENTS

| | | | |
|---|---|---|---|
| 7,221,104 B2 | 5/2007 | Lys et al. |
| 7,221,110 B2 | 5/2007 | Sears et al. |
| 7,224,000 B2 | 5/2007 | Aanegola et al. |
| 7,226,189 B2 | 6/2007 | Lee et al. |
| 7,228,052 B1 | 6/2007 | Lin |
| 7,228,190 B2 | 6/2007 | Dowling et al. |
| 7,231,060 B2 | 6/2007 | Dowling et al. |
| 7,233,115 B2 | 6/2007 | Lys |
| 7,233,831 B2 | 6/2007 | Blackwell |
| 7,236,366 B2 | 6/2007 | Chen |
| 7,237,924 B2 | 7/2007 | Martineau et al. |
| 7,237,925 B2 | 7/2007 | Mayer et al. |
| 7,239,532 B1 | 7/2007 | Hsu et al. |
| 7,241,038 B2 | 7/2007 | Naniwa et al. |
| 7,242,152 B2 | 7/2007 | Dowling et al. |
| 7,246,926 B2 | 7/2007 | Harwood |
| 7,246,931 B2 | 7/2007 | Hsieh et al. |
| 7,248,239 B2 | 7/2007 | Dowling et al. |
| 7,249,269 B1 | 7/2007 | Motoyama |
| 7,249,865 B2 | 7/2007 | Robertson |
| D548,868 S | 8/2007 | Roberge et al. |
| 7,252,408 B2 | 8/2007 | Mazzochette et al. |
| 7,253,566 B2 | 8/2007 | Lys et al. |
| 7,255,457 B2 | 8/2007 | Ducharme et al. |
| 7,255,460 B2 | 8/2007 | Lee |
| 7,256,554 B2 | 8/2007 | Lys |
| 7,258,458 B2 | 8/2007 | Mochiachvili et al. |
| 7,258,467 B2 | 8/2007 | Saccomanno et al. |
| 7,259,528 B2 | 8/2007 | Pilz |
| 7,262,439 B2 | 8/2007 | Setlur et al. |
| 7,262,559 B2 | 8/2007 | Tripathi et al. |
| 7,264,372 B2 | 9/2007 | Maglica |
| 7,267,467 B2 | 9/2007 | Wu et al. |
| 7,270,443 B2 | 9/2007 | Kurtz et al. |
| 7,271,794 B1 | 9/2007 | Cheng et al. |
| 7,273,300 B2 | 9/2007 | Mrakovich |
| 7,274,045 B2 | 9/2007 | Chandran et al. |
| 7,274,160 B2 | 9/2007 | Mueller et al. |
| D553,267 S | 10/2007 | Yuen |
| 7,285,801 B2 | 10/2007 | Eliashevich et al. |
| 7,288,902 B1 | 10/2007 | Melanson |
| 7,288,904 B2 | 10/2007 | Numeroli et al. |
| 7,296,912 B2 | 11/2007 | Beauchamp |
| 7,300,184 B2 | 11/2007 | Ichikawa et al. |
| 7,300,192 B2 | 11/2007 | Mueller et al. |
| D556,937 S | 12/2007 | Ly |
| D557,854 S | 12/2007 | Lewis |
| 7,303,300 B2 | 12/2007 | Dowling et al. |
| 7,306,353 B2 | 12/2007 | Popovich et al. |
| 7,307,391 B2 | 12/2007 | Shan |
| 7,308,296 B2 | 12/2007 | Lys et al. |
| 7,309,965 B2 | 12/2007 | Dowling et al. |
| 7,318,658 B2 | 1/2008 | Wang et al. |
| 7,319,244 B2 | 1/2008 | Liu et al. |
| 7,319,246 B2 | 1/2008 | Soules et al. |
| 7,321,191 B2 | 1/2008 | Setlur et al. |
| 7,326,964 B2 | 2/2008 | Lim et al. |
| 7,327,281 B2 | 2/2008 | Hutchison |
| 7,329,031 B2 | 2/2008 | Liaw et al. |
| D563,589 S | 3/2008 | Hariri et al. |
| 7,344,278 B2 | 3/2008 | Paravantsos |
| 7,345,320 B2 | 3/2008 | Dahm |
| 7,348,604 B2 | 3/2008 | Matheson |
| 7,350,936 B2 | 4/2008 | Ducharme et al. |
| 7,350,952 B2 | 4/2008 | Nishigaki |
| 7,352,138 B2 | 4/2008 | Lys et al. |
| 7,352,339 B2 | 4/2008 | Morgan et al. |
| 7,353,071 B2 | 4/2008 | Blackwell et al. |
| 7,358,679 B2 | 4/2008 | Lys et al. |
| 7,358,929 B2 | 4/2008 | Mueller et al. |
| 7,374,327 B2 | 5/2008 | Schexnaider |
| 7,378,805 B2 | 5/2008 | Oh et al. |
| 7,385,359 B2 | 6/2008 | Dowling et al. |
| 7,391,159 B2 | 6/2008 | Harwood |
| 7,396,146 B2 | 7/2008 | Wang |
| 7,401,935 B2 | 7/2008 | VanderSchuit |
| 7,401,945 B2 | 7/2008 | Zhang |
| 7,427,840 B2 | 9/2008 | Morgan et al. |
| 7,429,117 B2 | 9/2008 | Pohlert et al. |
| 7,434,964 B1 | 10/2008 | Zheng et al. |
| 7,438,441 B2 | 10/2008 | Sun et al. |
| D580,089 S | 11/2008 | Ly et al. |
| D581,556 S | 11/2008 | To et al. |
| 7,449,847 B2 | 11/2008 | Schanberger et al. |
| D582,577 S | 12/2008 | Yuen |
| 7,470,046 B2 | 12/2008 | Kao et al. |
| D584,428 S | 1/2009 | Li et al. |
| 7,476,002 B2 | 1/2009 | Wolf et al. |
| 7,476,004 B2 | 1/2009 | Chan |
| 7,478,924 B2 | 1/2009 | Robertson |
| D586,484 S | 2/2009 | Liu et al. |
| D586,928 S | 2/2009 | Liu et al. |
| 7,490,957 B2 | 2/2009 | Leong et al. |
| 7,497,596 B2 | 3/2009 | Ge |
| 7,498,753 B2 | 3/2009 | McAvoy et al. |
| 7,507,001 B2 | 3/2009 | Kit |
| 7,510,299 B2 | 3/2009 | Timmermans et al. |
| 7,510,400 B2 | 3/2009 | Glovatsky et al. |
| 7,514,876 B2 | 4/2009 | Roach, Jr. |
| 7,520,635 B2 | 4/2009 | Wolf et al. |
| 7,521,872 B2 | 4/2009 | Bruning |
| 7,524,089 B2 | 4/2009 | Park |
| D592,766 S | 5/2009 | Zhu et al. |
| D593,223 S | 5/2009 | Komar |
| 7,530,701 B2 | 5/2009 | Chan-Wing |
| 7,534,002 B2 | 5/2009 | Yamaguchi et al. |
| 7,549,769 B2 | 6/2009 | Kim et al. |
| 7,556,396 B2 | 7/2009 | Kuo et al. |
| 7,559,663 B2 | 7/2009 | Wong et al. |
| 7,562,998 B1 | 7/2009 | Yen |
| 7,569,981 B1 | 8/2009 | Ciancanelli |
| 7,572,030 B2 | 8/2009 | Booth et al. |
| 7,575,339 B2 | 8/2009 | Hung |
| 7,579,786 B2 | 8/2009 | Soos |
| 7,583,035 B2 | 9/2009 | Shteynberg et al. |
| 7,583,901 B2 | 9/2009 | Nakagawa et al. |
| 7,594,738 B1 | 9/2009 | Lin et al. |
| 7,598,681 B2 | 10/2009 | Lys et al. |
| 7,598,684 B2 | 10/2009 | Lys et al. |
| 7,600,907 B2 | 10/2009 | Liu et al. |
| 7,602,559 B2 | 10/2009 | Jang et al. |
| 7,618,157 B1 | 11/2009 | Galvez et al. |
| 7,619,366 B2 | 11/2009 | Diederiks |
| 7,635,201 B2 | 12/2009 | Deng |
| 7,639,517 B2 | 12/2009 | Zhou et al. |
| 7,648,251 B2 | 1/2010 | Whitehouse et al. |
| D612,528 S | 3/2010 | McGrath et al. |
| 7,690,813 B2 | 4/2010 | Kanamori et al. |
| 7,710,047 B2 | 5/2010 | Shteynberg et al. |
| 7,710,253 B1 | 5/2010 | Fredricks |
| 7,712,918 B2 | 5/2010 | Siemiet et al. |
| 7,748,886 B2 | 7/2010 | Pazula et al. |
| 7,815,341 B2 | 10/2010 | Steedly et al. |
| 7,828,471 B2 | 11/2010 | Lin |
| 7,843,150 B2 | 11/2010 | Wang et al. |
| RE42,161 E | 2/2011 | Hochstein |
| 7,887,226 B2 | 2/2011 | Huang et al. |
| D634,452 S | 3/2011 | de Visser |
| 7,938,562 B2 | 5/2011 | Ivey et al. |
| 7,976,196 B2 | 7/2011 | Ivey et al. |
| 7,990,070 B2 | 8/2011 | Nerone |
| 8,013,472 B2 | 9/2011 | Adest et al. |
| D650,097 S | 12/2011 | Trumble et al. |
| D650,494 S | 12/2011 | Tsao et al. |
| 8,093,823 B1 | 1/2012 | Ivey et al. |
| D654,192 S | 2/2012 | Maxik et al. |
| 8,159,152 B1 | 4/2012 | Salessi |
| 8,167,452 B2 | 5/2012 | Chou |
| 8,177,388 B2 | 5/2012 | Yen |
| 8,179,037 B2 | 5/2012 | Chan et al. |
| 8,214,084 B2 | 7/2012 | Ivey et al. |
| 8,247,985 B2 | 8/2012 | Timmermans et al. |
| 8,262,249 B2 | 9/2012 | Hsia et al. |
| 8,272,764 B2 | 9/2012 | Son |

(56) References Cited

U.S. PATENT DOCUMENTS

| | | |
|---|---|---|
| 8,287,144 B2 | 10/2012 | Pedersen et al. |
| 8,297,788 B2 | 10/2012 | Bishop |
| 8,304,993 B2 | 11/2012 | Tzou et al. |
| 8,313,213 B2 | 11/2012 | Lin et al. |
| 8,319,407 B2 | 11/2012 | Ke |
| 8,319,433 B2 | 11/2012 | Lin et al. |
| 8,319,437 B2 | 11/2012 | Carlin et al. |
| 8,322,878 B2 | 12/2012 | Hsia et al. |
| 8,337,071 B2 | 12/2012 | Negley et al. |
| 2001/0033488 A1 | 10/2001 | Chliwnyj et al. |
| 2001/0045803 A1 | 11/2001 | Cencur |
| 2002/0011801 A1 | 1/2002 | Chang |
| 2002/0015297 A1 | 2/2002 | Hayashi et al. |
| 2002/0038157 A1 | 3/2002 | Dowling et al. |
| 2002/0041159 A1* | 4/2002 | Kaping, Jr. .................. 315/56 |
| 2002/0044066 A1 | 4/2002 | Dowling et al. |
| 2002/0047569 A1 | 4/2002 | Dowling et al. |
| 2002/0047624 A1 | 4/2002 | Stam et al. |
| 2002/0047628 A1 | 4/2002 | Morgan et al. |
| 2002/0048169 A1 | 4/2002 | Dowling et al. |
| 2002/0057061 A1 | 5/2002 | Mueller et al. |
| 2002/0060526 A1 | 5/2002 | Timmermans et al. |
| 2002/0070688 A1 | 6/2002 | Dowling et al. |
| 2002/0074559 A1 | 6/2002 | Dowling et al. |
| 2002/0074958 A1 | 6/2002 | Crenshaw |
| 2002/0078221 A1 | 6/2002 | Blackwell et al. |
| 2002/0101197 A1 | 8/2002 | Lys et al. |
| 2002/0113555 A1 | 8/2002 | Lys et al. |
| 2002/0130627 A1 | 9/2002 | Morgan et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0152298 A1 | 10/2002 | Kikta et al. |
| 2002/0153851 A1 | 10/2002 | Morgan et al. |
| 2002/0158583 A1 | 10/2002 | Lys et al. |
| 2002/0163316 A1 | 11/2002 | Lys et al. |
| 2002/0171365 A1 | 11/2002 | Morgan et al. |
| 2002/0171377 A1 | 11/2002 | Mueller et al. |
| 2002/0171378 A1 | 11/2002 | Morgan et al. |
| 2002/0176259 A1 | 11/2002 | Ducharme |
| 2002/0179816 A1 | 12/2002 | Haines et al. |
| 2002/0195975 A1 | 12/2002 | Schanberger et al. |
| 2003/0011538 A1 | 1/2003 | Lys et al. |
| 2003/0028260 A1 | 2/2003 | Blackwell |
| 2003/0031015 A1 | 2/2003 | Ishibashi |
| 2003/0048641 A1 | 3/2003 | Alexanderson et al. |
| 2003/0057884 A1 | 3/2003 | Dowling et al. |
| 2003/0057886 A1 | 3/2003 | Lys et al. |
| 2003/0057887 A1 | 3/2003 | Dowling et al. |
| 2003/0057890 A1 | 3/2003 | Lys et al. |
| 2003/0076281 A1 | 4/2003 | Morgan et al. |
| 2003/0085710 A1 | 5/2003 | Bourgault et al. |
| 2003/0095404 A1 | 5/2003 | Becks et al. |
| 2003/0100837 A1 | 5/2003 | Lys et al. |
| 2003/0102810 A1 | 6/2003 | Cross et al. |
| 2003/0133292 A1 | 7/2003 | Mueller et al. |
| 2003/0137258 A1 | 7/2003 | Piepgras et al. |
| 2003/0185005 A1 | 10/2003 | Sommers et al. |
| 2003/0185014 A1 | 10/2003 | Gloisten |
| 2003/0189412 A1 | 10/2003 | Cunningham |
| 2003/0218879 A1 | 11/2003 | Tieszen |
| 2003/0222587 A1 | 12/2003 | Dowling, Jr. et al. |
| 2003/0234342 A1 | 12/2003 | Gaines et al. |
| 2004/0003545 A1 | 1/2004 | Gillespie |
| 2004/0012959 A1 | 1/2004 | Robertson et al. |
| 2004/0036006 A1 | 2/2004 | Dowling |
| 2004/0037088 A1 | 2/2004 | English et al. |
| 2004/0052076 A1 | 3/2004 | Mueller et al. |
| 2004/0062041 A1 | 4/2004 | Cross et al. |
| 2004/0075572 A1 | 4/2004 | Buschmann et al. |
| 2004/0080960 A1 | 4/2004 | Wu |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0105264 A1 | 6/2004 | Spero |
| 2004/0113568 A1 | 6/2004 | Dowling et al. |
| 2004/0114371 A1 | 6/2004 | Lea et al. |
| 2004/0116039 A1 | 6/2004 | Mueller et al. |
| 2004/0124782 A1 | 7/2004 | Yu |
| 2004/0130908 A1 | 7/2004 | McClurg et al. |
| 2004/0130909 A1 | 7/2004 | Mueller et al. |
| 2004/0141321 A1 | 7/2004 | Dowling et al. |
| 2004/0145886 A1 | 7/2004 | Fatemi et al. |
| 2004/0155609 A1 | 8/2004 | Lys et al. |
| 2004/0160199 A1 | 8/2004 | Morgan et al. |
| 2004/0178751 A1 | 9/2004 | Mueller et al. |
| 2004/0189218 A1 | 9/2004 | Leong et al. |
| 2004/0189262 A1 | 9/2004 | McGrath |
| 2004/0212320 A1 | 10/2004 | Dowling et al. |
| 2004/0212321 A1 | 10/2004 | Lys et al. |
| 2004/0212993 A1 | 10/2004 | Morgan et al. |
| 2004/0223328 A1 | 11/2004 | Lee et al. |
| 2004/0240890 A1 | 12/2004 | Lys et al. |
| 2004/0251854 A1 | 12/2004 | Matsuda et al. |
| 2004/0257007 A1 | 12/2004 | Lys et al. |
| 2005/0013133 A1 | 1/2005 | Yeh |
| 2005/0024877 A1 | 2/2005 | Frederick |
| 2005/0030744 A1 | 2/2005 | Ducharme et al. |
| 2005/0035728 A1 | 2/2005 | Schanberger et al. |
| 2005/0036300 A1 | 2/2005 | Dowling et al. |
| 2005/0040774 A1 | 2/2005 | Mueller et al. |
| 2005/0041161 A1 | 2/2005 | Dowling et al. |
| 2005/0041424 A1 | 2/2005 | Ducharme |
| 2005/0043907 A1 | 2/2005 | Eckel et al. |
| 2005/0044617 A1 | 3/2005 | Mueller et al. |
| 2005/0047132 A1 | 3/2005 | Dowling et al. |
| 2005/0047134 A1 | 3/2005 | Mueller et al. |
| 2005/0062440 A1 | 3/2005 | Lys et al. |
| 2005/0063194 A1 | 3/2005 | Lys et al. |
| 2005/0078477 A1 | 4/2005 | Lo |
| 2005/0099824 A1 | 5/2005 | Dowling et al. |
| 2005/0107694 A1 | 5/2005 | Jansen et al. |
| 2005/0110384 A1 | 5/2005 | Peterson |
| 2005/0116667 A1 | 6/2005 | Mueller et al. |
| 2005/0128751 A1 | 6/2005 | Roberge et al. |
| 2005/0141225 A1 | 6/2005 | Striebel |
| 2005/0151489 A1 | 7/2005 | Lys et al. |
| 2005/0151663 A1 | 7/2005 | Tanguay |
| 2005/0154494 A1 | 7/2005 | Ahmed |
| 2005/0162093 A1 | 7/2005 | Timmermans et al. |
| 2005/0162100 A1 | 7/2005 | Romano et al. |
| 2005/0162101 A1 | 7/2005 | Leong et al. |
| 2005/0174473 A1 | 8/2005 | Morgan et al. |
| 2005/0174780 A1 | 8/2005 | Park |
| 2005/0184667 A1 | 8/2005 | Sturman et al. |
| 2005/0201112 A1 | 9/2005 | Machi et al. |
| 2005/0206529 A1 | 9/2005 | St.-Germain |
| 2005/0213320 A1 | 9/2005 | Kazuhiro et al. |
| 2005/0213352 A1 | 9/2005 | Lys |
| 2005/0213353 A1 | 9/2005 | Lys |
| 2005/0218838 A1 | 10/2005 | Lys |
| 2005/0218870 A1 | 10/2005 | Lys |
| 2005/0219860 A1 | 10/2005 | Schexnaider |
| 2005/0219872 A1 | 10/2005 | Lys |
| 2005/0225979 A1 | 10/2005 | Robertson et al. |
| 2005/0231133 A1 | 10/2005 | Lys |
| 2005/0236029 A1 | 10/2005 | Dowling |
| 2005/0236998 A1 | 10/2005 | Mueller et al. |
| 2005/0242742 A1 | 11/2005 | Cheang et al. |
| 2005/0243577 A1 | 11/2005 | Moon |
| 2005/0248299 A1 | 11/2005 | Chemel et al. |
| 2005/0253533 A1 | 11/2005 | Lys et al. |
| 2005/0259424 A1 | 11/2005 | Zampini, II et al. |
| 2005/0264474 A1 | 12/2005 | Rast |
| 2005/0265019 A1 | 12/2005 | Sommers et al. |
| 2005/0275626 A1 | 12/2005 | Mueller et al. |
| 2005/0276051 A1 | 12/2005 | Caudle et al. |
| 2005/0276053 A1 | 12/2005 | Nortrup et al. |
| 2005/0276064 A1 | 12/2005 | Wu et al. |
| 2005/0281030 A1 | 12/2005 | Leong et al. |
| 2005/0285547 A1 | 12/2005 | Piepgras et al. |
| 2006/0002110 A1 | 1/2006 | Dowling et al. |
| 2006/0012987 A9 | 1/2006 | Ducharme et al. |
| 2006/0012997 A1 | 1/2006 | Catalano et al. |

(56) References Cited

U.S. PATENT DOCUMENTS

| | | |
|---|---|---|
| 2006/0016960 A1 | 1/2006 | Morgan et al. |
| 2006/0022214 A1 | 2/2006 | Morgan et al. |
| 2006/0028155 A1 | 2/2006 | Young |
| 2006/0028837 A1 | 2/2006 | Mrakovich |
| 2006/0034078 A1 | 2/2006 | Kovacik et al. |
| 2006/0050509 A9 | 3/2006 | Dowling et al. |
| 2006/0050514 A1 | 3/2006 | Opolka |
| 2006/0056855 A1 | 3/2006 | Nakagawa et al. |
| 2006/0066447 A1 | 3/2006 | Davenport et al. |
| 2006/0071614 A1 | 4/2006 | Tripathi et al. |
| 2006/0076908 A1 | 4/2006 | Morgan et al. |
| 2006/0081863 A1 | 4/2006 | Kim et al. |
| 2006/0092640 A1 | 5/2006 | Li |
| 2006/0098077 A1 | 5/2006 | Dowling |
| 2006/0104058 A1 | 5/2006 | Chemel et al. |
| 2006/0109648 A1 | 5/2006 | Trenchard et al. |
| 2006/0109649 A1 | 5/2006 | Ducharme et al. |
| 2006/0109661 A1 | 5/2006 | Coushaine et al. |
| 2006/0126325 A1 | 6/2006 | Lefebvre et al. |
| 2006/0126338 A1 | 6/2006 | Mighetto |
| 2006/0132061 A1 | 6/2006 | McCormick et al. |
| 2006/0132323 A1 | 6/2006 | Grady, Jr. |
| 2006/0146531 A1 | 7/2006 | Reo et al. |
| 2006/0152172 A9 | 7/2006 | Mueller et al. |
| 2006/0158881 A1 | 7/2006 | Dowling |
| 2006/0170376 A1 | 8/2006 | Piepgras et al. |
| 2006/0192502 A1 | 8/2006 | Brown et al. |
| 2006/0193131 A1 | 8/2006 | McGrath et al. |
| 2006/0197661 A1 | 9/2006 | Tracy et al. |
| 2006/0198128 A1 | 9/2006 | Piepgras et al. |
| 2006/0208667 A1 | 9/2006 | Lys et al. |
| 2006/0220595 A1 | 10/2006 | Lu |
| 2006/0221606 A1 | 10/2006 | Dowling |
| 2006/0221619 A1 | 10/2006 | Nishigaki |
| 2006/0227558 A1 | 10/2006 | Osawa et al. |
| 2006/0232974 A1 | 10/2006 | Lee et al. |
| 2006/0238884 A1 | 10/2006 | Jang et al. |
| 2006/0262516 A9 | 11/2006 | Dowling et al. |
| 2006/0262521 A1 | 11/2006 | Piepgras et al. |
| 2006/0262544 A1 | 11/2006 | Piepgras et al. |
| 2006/0262545 A1 | 11/2006 | Piepgras et al. |
| 2006/0265921 A1 | 11/2006 | Korall et al. |
| 2006/0273741 A1 | 12/2006 | Stalker, III |
| 2006/0274529 A1 | 12/2006 | Cao |
| 2006/0285325 A1 | 12/2006 | Ducharme et al. |
| 2007/0035255 A1 | 2/2007 | Shuster et al. |
| 2007/0035538 A1 | 2/2007 | Garcia et al. |
| 2007/0035965 A1 | 2/2007 | Holst |
| 2007/0040516 A1 | 2/2007 | Chen |
| 2007/0041220 A1 | 2/2007 | Lynch |
| 2007/0047227 A1 | 3/2007 | Ducharme |
| 2007/0053182 A1 | 3/2007 | Robertson |
| 2007/0053208 A1 | 3/2007 | Justel et al. |
| 2007/0064419 A1 | 3/2007 | Gandhi |
| 2007/0064425 A1 | 3/2007 | Frecska et al. |
| 2007/0070621 A1 | 3/2007 | Rivas et al. |
| 2007/0070631 A1 | 3/2007 | Huang et al. |
| 2007/0081423 A1 | 4/2007 | Chien |
| 2007/0086754 A1 | 4/2007 | Lys et al. |
| 2007/0086912 A1 | 4/2007 | Dowling et al. |
| 2007/0097678 A1 | 5/2007 | Yang |
| 2007/0109763 A1 | 5/2007 | Wolf et al. |
| 2007/0115658 A1 | 5/2007 | Mueller et al. |
| 2007/0115665 A1 | 5/2007 | Mueller et al. |
| 2007/0120594 A1 | 5/2007 | Balakrishnan et al. |
| 2007/0127234 A1 | 6/2007 | Jervey, III |
| 2007/0133202 A1 | 6/2007 | Huang et al. |
| 2007/0139938 A1 | 6/2007 | Petroski et al. |
| 2007/0145915 A1 | 6/2007 | Roberge et al. |
| 2007/0146126 A1 | 6/2007 | Wang |
| 2007/0147046 A1 | 6/2007 | Arik et al. |
| 2007/0152797 A1 | 7/2007 | Chemel et al. |
| 2007/0152808 A1 | 7/2007 | LaCasse |
| 2007/0153514 A1 | 7/2007 | Dowling et al. |
| 2007/0159828 A1 | 7/2007 | Wang |
| 2007/0165402 A1 | 7/2007 | Weaver, Jr. et al. |
| 2007/0165405 A1 | 7/2007 | Chen |
| 2007/0173978 A1 | 7/2007 | Fein et al. |
| 2007/0177382 A1 | 8/2007 | Pritchard et al. |
| 2007/0182387 A1 | 8/2007 | Weirich |
| 2007/0188114 A1 | 8/2007 | Lys et al. |
| 2007/0188427 A1 | 8/2007 | Lys et al. |
| 2007/0189026 A1 | 8/2007 | Chemel et al. |
| 2007/0195526 A1 | 8/2007 | Dowling et al. |
| 2007/0195527 A1 | 8/2007 | Russell |
| 2007/0195532 A1 | 8/2007 | Reisenauer et al. |
| 2007/0200725 A1 | 8/2007 | Fredericks et al. |
| 2007/0205712 A1 | 9/2007 | Radkov et al. |
| 2007/0206375 A1 | 9/2007 | Piepgras et al. |
| 2007/0211463 A1 | 9/2007 | Chevalier et al. |
| 2007/0228999 A1 | 10/2007 | Kit |
| 2007/0235751 A1 | 10/2007 | Radkov et al. |
| 2007/0236156 A1 | 10/2007 | Lys et al. |
| 2007/0237284 A1 | 10/2007 | Lys et al. |
| 2007/0240346 A1 | 10/2007 | Li et al. |
| 2007/0241657 A1 | 10/2007 | Radkov et al. |
| 2007/0242466 A1 | 10/2007 | Wu et al. |
| 2007/0247450 A1 | 10/2007 | Lee |
| 2007/0247842 A1 | 10/2007 | Zampini et al. |
| 2007/0247847 A1 | 10/2007 | Villard |
| 2007/0247851 A1 | 10/2007 | Villard |
| 2007/0252161 A1 | 11/2007 | Meis et al. |
| 2007/0258231 A1 | 11/2007 | Koerner et al. |
| 2007/0258240 A1 | 11/2007 | Ducharme et al. |
| 2007/0263379 A1 | 11/2007 | Dowling |
| 2007/0274070 A1 | 11/2007 | Wedell |
| 2007/0281520 A1 | 12/2007 | Insalaco et al. |
| 2007/0285926 A1 | 12/2007 | Maxik |
| 2007/0285933 A1 | 12/2007 | Southard et al. |
| 2007/0290625 A1 | 12/2007 | He et al. |
| 2007/0291483 A1 | 12/2007 | Lys |
| 2007/0296350 A1 | 12/2007 | Maxik et al. |
| 2008/0003664 A1 | 1/2008 | Tysoe et al. |
| 2008/0007945 A1 | 1/2008 | Kelly et al. |
| 2008/0012502 A1 | 1/2008 | Lys |
| 2008/0012506 A1 | 1/2008 | Mueller et al. |
| 2008/0013316 A1 | 1/2008 | Chiang |
| 2008/0013324 A1 | 1/2008 | Yu |
| 2008/0018261 A1 | 1/2008 | Kastner |
| 2008/0024067 A1 | 1/2008 | Ishibashi |
| 2008/0037226 A1 | 2/2008 | Shin et al. |
| 2008/0037245 A1 | 2/2008 | Chan |
| 2008/0037284 A1 | 2/2008 | Rudisill |
| 2008/0055894 A1 | 3/2008 | Deng |
| 2008/0062680 A1 | 3/2008 | Timmermans et al. |
| 2008/0068838 A1 | 3/2008 | Galke et al. |
| 2008/0068839 A1 | 3/2008 | Matheson |
| 2008/0074872 A1 | 3/2008 | Panotopoulos |
| 2008/0089075 A1 | 4/2008 | Hsu |
| 2008/0092800 A1 | 4/2008 | Smith et al. |
| 2008/0093615 A1 | 4/2008 | Lin et al. |
| 2008/0093998 A1 | 4/2008 | Dennery et al. |
| 2008/0094819 A1 | 4/2008 | Vaish |
| 2008/0094837 A1 | 4/2008 | Dobbins et al. |
| 2008/0129211 A1 | 6/2008 | Lin et al. |
| 2008/0130267 A1 | 6/2008 | Dowling et al. |
| 2008/0150444 A1 | 6/2008 | Usui et al. |
| 2008/0151535 A1 | 6/2008 | de Castris |
| 2008/0158871 A1 | 7/2008 | McAvoy et al. |
| 2008/0158887 A1 | 7/2008 | Zhu et al. |
| 2008/0164826 A1 | 7/2008 | Lys |
| 2008/0164827 A1 | 7/2008 | Lys |
| 2008/0164854 A1 | 7/2008 | Lys |
| 2008/0175003 A1 | 7/2008 | Tsou et al. |
| 2008/0180036 A1 | 7/2008 | Garrity et al. |
| 2008/0186704 A1 | 8/2008 | Chou et al. |
| 2008/0192436 A1 | 8/2008 | Peng et al. |
| 2008/0198598 A1 | 8/2008 | Ward |
| 2008/0211386 A1 | 9/2008 | Choi et al. |
| 2008/0211419 A1 | 9/2008 | Garrity |
| 2008/0218993 A1 | 9/2008 | Li |
| 2008/0224629 A1 | 9/2008 | Melanson |
| 2008/0224636 A1 | 9/2008 | Melanson |
| 2008/0253125 A1 | 10/2008 | Kang et al. |

(56) References Cited

U.S. PATENT DOCUMENTS

| | | |
|---|---|---|
| 2008/0258631 A1 | 10/2008 | Wu et al. |
| 2008/0258647 A1 | 10/2008 | Scianna |
| 2008/0278092 A1 | 11/2008 | Lys et al. |
| 2008/0285257 A1 | 11/2008 | King |
| 2008/0285266 A1 | 11/2008 | Thomas |
| 2008/0290814 A1 | 11/2008 | Leong et al. |
| 2008/0291675 A1 | 11/2008 | Lin et al. |
| 2008/0298080 A1 | 12/2008 | Wu et al. |
| 2008/0310119 A1 | 12/2008 | Giacoma |
| 2008/0315773 A1 | 12/2008 | Pang |
| 2008/0315784 A1 | 12/2008 | Tseng |
| 2009/0002995 A1 | 1/2009 | Lee et al. |
| 2009/0016063 A1 | 1/2009 | Hu |
| 2009/0021140 A1 | 1/2009 | Takasu et al. |
| 2009/0046473 A1 | 2/2009 | Tsai et al. |
| 2009/0052186 A1 | 2/2009 | Xue |
| 2009/0059557 A1 | 3/2009 | Tanaka |
| 2009/0059559 A1 | 3/2009 | Pabst et al. |
| 2009/0067170 A1 | 3/2009 | Bloemen et al. |
| 2009/0067182 A1 | 3/2009 | Hsu et al. |
| 2009/0073693 A1* | 3/2009 | Nall et al. ............... 362/249.02 |
| 2009/0086492 A1 | 4/2009 | Meyer |
| 2009/0091929 A1 | 4/2009 | Faubion |
| 2009/0091938 A1 | 4/2009 | Jacobson et al. |
| 2009/0101930 A1 | 4/2009 | Li |
| 2009/0139690 A1 | 6/2009 | Maerz et al. |
| 2009/0140285 A1 | 6/2009 | Lin et al. |
| 2009/0175041 A1 | 7/2009 | Yuen et al. |
| 2009/0185373 A1 | 7/2009 | Grajcar |
| 2009/0195186 A1 | 8/2009 | Guest et al. |
| 2009/0196034 A1 | 8/2009 | Gherardini et al. |
| 2009/0213588 A1 | 8/2009 | Manes |
| 2009/0219713 A1 | 9/2009 | Siemiet et al. |
| 2009/0231831 A1 | 9/2009 | Hsiao et al. |
| 2009/0268461 A1 | 10/2009 | Deak et al. |
| 2009/0273926 A1 | 11/2009 | Deng |
| 2009/0284169 A1 | 11/2009 | Valois |
| 2009/0290334 A1 | 11/2009 | Ivey et al. |
| 2009/0296381 A1* | 12/2009 | Dubord ........................ 362/218 |
| 2009/0303720 A1 | 12/2009 | McGrath |
| 2009/0316408 A1 | 12/2009 | Villard |
| 2010/0008085 A1 | 1/2010 | Ivey et al. |
| 2010/0019689 A1 | 1/2010 | Shan |
| 2010/0027259 A1 | 2/2010 | Simon et al. |
| 2010/0033095 A1 | 2/2010 | Sadwick |
| 2010/0033964 A1 | 2/2010 | Choi et al. |
| 2010/0046222 A1 | 2/2010 | Yang |
| 2010/0071946 A1* | 3/2010 | Hashimoto ................... 174/260 |
| 2010/0073944 A1 | 3/2010 | Chen |
| 2010/0079085 A1 | 4/2010 | Wendt et al. |
| 2010/0096992 A1 | 4/2010 | Yamamoto et al. |
| 2010/0096998 A1 | 4/2010 | Beers |
| 2010/0103664 A1 | 4/2010 | Simon et al. |
| 2010/0103673 A1 | 4/2010 | Ivey et al. |
| 2010/0109550 A1 | 5/2010 | Huda et al. |
| 2010/0109558 A1 | 5/2010 | Chew |
| 2010/0148650 A1 | 6/2010 | Wu et al. |
| 2010/0149806 A1 | 6/2010 | Yiu |
| 2010/0157608 A1 | 6/2010 | Chen et al. |
| 2010/0164404 A1 | 7/2010 | Shao et al. |
| 2010/0181178 A1 | 7/2010 | Chang et al. |
| 2010/0265732 A1 | 10/2010 | Liu |
| 2010/0270925 A1 | 10/2010 | Withers |
| 2010/0277069 A1 | 11/2010 | Janik et al. |
| 2010/0289418 A1 | 11/2010 | Langovsky |
| 2010/0320922 A1 | 12/2010 | Palazzolo et al. |
| 2011/0006658 A1 | 1/2011 | Chan et al. |
| 2011/0090682 A1 | 4/2011 | Zheng et al. |
| 2011/0109454 A1 | 5/2011 | McSheffrey, Sr. et al. |
| 2011/0156584 A1 | 6/2011 | Kim |
| 2011/0176298 A1 | 7/2011 | Meurer et al. |
| 2011/0199769 A1 | 8/2011 | Bretschneider et al. |
| 2012/0008315 A1* | 1/2012 | Simon et al. ............. 362/217.13 |
| 2012/0043892 A1 | 2/2012 | Visser et al. |
| 2012/0063140 A1 | 3/2012 | Kong |
| 2012/0106144 A1 | 5/2012 | Chang |
| 2012/0113628 A1 | 5/2012 | Burrow et al. |
| 2012/0127726 A1 | 5/2012 | Yen |
| 2012/0146503 A1 | 6/2012 | Negley et al. |
| 2012/0147597 A1 | 6/2012 | Farmer |
| 2012/0153865 A1 | 6/2012 | Rolfes et al. |
| 2012/0155073 A1 | 6/2012 | McCanless et al. |
| 2012/0161666 A1 | 6/2012 | Antony et al. |
| 2012/0194086 A1 | 8/2012 | Liu et al. |
| 2012/0195032 A1 | 8/2012 | Shew |
| 2012/0212951 A1 | 8/2012 | Lai et al. |
| 2012/0212953 A1 | 8/2012 | Bloom et al. |
| 2012/0230044 A1 | 9/2012 | Zhang et al. |
| 2012/0236533 A1 | 9/2012 | Nakamura et al. |
| 2012/0236554 A1 | 9/2012 | Rust |
| 2012/0243216 A1 | 9/2012 | Lai et al. |
| 2012/0243217 A1 | 9/2012 | Szprengiel et al. |
| 2012/0274214 A1 | 11/2012 | Radermacher et al. |
| 2012/0275154 A1 | 11/2012 | Hood et al. |
| 2012/0293991 A1 | 11/2012 | Lin |
| 2012/0293996 A1 | 11/2012 | Thomas et al. |
| 2012/0300445 A1 | 11/2012 | Chu et al. |
| 2012/0300468 A1 | 11/2012 | Chang et al. |
| 2012/0300486 A1* | 11/2012 | Matsushita et al. ............ 362/521 |
| 2012/0307524 A1 | 12/2012 | Schapira et al. |
| 2012/0320598 A1 | 12/2012 | Son |
| 2013/0206597 A1* | 8/2013 | Wang et al. .................... 204/450 |

FOREIGN PATENT DOCUMENTS

| | | |
|---|---|---|
| CN | 2869556 Y | 2/2007 |
| CN | 201129681 Y | 10/2008 |
| CN | 201184574 Y | 1/2009 |
| CN | 101737664 A1 | 6/2010 |
| DE | 19651140 A1 | 6/1997 |
| DE | 19624087 A1 | 12/1997 |
| DE | 20018865 U1 | 2/2001 |
| EP | 0013782 B1 | 3/1983 |
| EP | 0091172 A2 | 10/1983 |
| EP | 0124924 B1 | 9/1987 |
| EP | 0174699 B1 | 11/1988 |
| EP | 0197602 B1 | 11/1990 |
| EP | 0214701 B1 | 3/1992 |
| EP | 0262713 B1 | 6/1992 |
| EP | 0203668 B1 | 2/1993 |
| EP | 0525876 | 2/1993 |
| EP | 0272749 B1 | 8/1993 |
| EP | 0337567 B1 | 11/1993 |
| EP | 0390262 B1 | 12/1993 |
| EP | 0359329 B1 | 3/1994 |
| EP | 0403011 B1 | 4/1994 |
| EP | 0632511 | 1/1995 |
| EP | 0432848 B1 | 4/1995 |
| EP | 0659531 A1 | 6/1995 |
| EP | 0403001 B1 | 8/1995 |
| EP | 0714556 | 1/1999 |
| EP | 0889283 | 1/1999 |
| EP | 0458408 B1 | 9/1999 |
| EP | 0578302 B1 | 9/1999 |
| EP | 0723701 B1 | 1/2000 |
| EP | 0787419 B1 | 5/2001 |
| EP | 1149510 B1 | 10/2001 |
| EP | 1157428 B1 | 11/2001 |
| EP | 1166604 B1 | 1/2002 |
| EP | 1194918 B1 | 4/2002 |
| EP | 1195740 A3 | 4/2002 |
| EP | 1016062 B1 | 8/2002 |
| EP | 1056993 B1 | 3/2003 |
| EP | 0766436 B1 | 5/2003 |
| EP | 0924281 B1 | 5/2003 |
| EP | 0826167 B1 | 6/2003 |
| EP | 1321012 B1 | 6/2003 |
| EP | 1337784 B1 | 8/2003 |
| EP | 1346609 B1 | 9/2003 |
| EP | 1348318 B1 | 10/2003 |
| EP | 1348319 B1 | 10/2003 |
| EP | 1147686 B1 | 1/2004 |
| EP | 1142452 B1 | 3/2004 |
| EP | 1145602 B1 | 3/2004 |

(56) References Cited

FOREIGN PATENT DOCUMENTS

| | | |
|---|---|---|
| EP | 1399694 B1 | 3/2004 |
| EP | 1415517 B1 | 5/2004 |
| EP | 1415518 B1 | 5/2004 |
| EP | 1422975 A1 | 5/2004 |
| EP | 0890059 B1 | 6/2004 |
| EP | 1438877 B1 | 7/2004 |
| EP | 1440604 B1 | 7/2004 |
| EP | 1459599 B1 | 9/2004 |
| EP | 1461980 B1 | 9/2004 |
| EP | 1461982 B1 | 9/2004 |
| EP | 1479270 B1 | 11/2004 |
| EP | 1500307 | 1/2005 |
| EP | 1502483 B1 | 2/2005 |
| EP | 1518445 B1 | 3/2005 |
| EP | 1537354 B1 | 6/2005 |
| EP | 1037862 B1 | 7/2005 |
| EP | 1576858 B1 | 9/2005 |
| EP | 1579733 B1 | 9/2005 |
| EP | 1579736 B1 | 9/2005 |
| EP | 1610593 | 12/2005 |
| EP | 1624728 A1 | 2/2006 |
| EP | 1646092 B1 | 4/2006 |
| EP | 1763650 B1 | 3/2007 |
| EP | 1110120 B1 | 4/2007 |
| EP | 1776722 B1 | 4/2007 |
| EP | 1047903 B1 | 6/2007 |
| EP | 0922305 B1 | 8/2007 |
| EP | 0922306 B1 | 8/2007 |
| EP | 1833035 A1 | 9/2007 |
| EP | 1048085 B1 | 11/2007 |
| EP | 1873012 | 1/2008 |
| EP | 1887836 A2 | 2/2008 |
| EP | 1889519 | 2/2008 |
| EP | 1145282 B1 | 7/2008 |
| EP | 1000522 B1 | 12/2008 |
| EP | 2013530 B1 | 1/2009 |
| EP | 2469155 A1 | 6/2012 |
| FR | 2813115 | 2/2002 |
| GB | 2215024 A | 9/1989 |
| GB | 2324901 A | 11/1998 |
| GB | 2447257 A | 9/2008 |
| GB | 2472345 A | 2/2011 |
| GB | 2486410 A | 6/2012 |
| JP | 3154200 | 7/1991 |
| JP | H6-54103 U | 7/1994 |
| JP | 7264036 | 10/1995 |
| JP | 8162677 A | 6/1996 |
| JP | 11135274 A | 5/1999 |
| JP | H11-162234 A | 6/1999 |
| JP | H11-260125 A | 9/1999 |
| JP | 2001238272 A | 8/2001 |
| JP | 2001291406 A | 10/2001 |
| JP | 2002141555 A | 5/2002 |
| JP | 3098271 U | 2/2004 |
| JP | 2004119078 A | 4/2004 |
| JP | 2004273234 A | 9/2004 |
| JP | 2004335426 | 11/2004 |
| JP | 2005158363 A | 6/2005 |
| JP | 2005166617 A | 6/2005 |
| JP | 2005322866 A | 11/2005 |
| JP | 2005347214 A | 12/2005 |
| JP | 2006054289 | 2/2006 |
| JP | 2006507641 A | 3/2006 |
| JP | 2007227342 A | 9/2007 |
| JP | 2007249467 | 9/2007 |
| JP | 3139714 U | 2/2008 |
| JP | 2008186758 A | 8/2008 |
| JP | 2008258124 A | 10/2008 |
| JP | 2008293753 A | 12/2008 |
| JP | 2010192229 A1 | 9/2010 |
| JP | 2010205553 A | 9/2010 |
| KR | 10-2004-0008244 A | 1/2004 |
| KR | 10-2006-0112113 A | 10/2006 |
| KR | 200430022 Y1 | 11/2006 |
| KR | 10-2006-0133784 A | 12/2006 |
| KR | 10-2007-0063595 A | 6/2007 |
| KR | 100781652 | 12/2007 |
| KR | 100844538 B1 | 7/2008 |
| KR | 10-0888669 B1 | 3/2009 |
| KR | 100888669 | 3/2009 |
| KR | 100927851 B1 | 11/2009 |
| TW | M337036 | 7/2008 |
| WO | 9906759 A1 | 2/1999 |
| WO | 9910867 A2 | 3/1999 |
| WO | 9931560 A2 | 6/1999 |
| WO | 9945312 A1 | 9/1999 |
| WO | 9957945 A1 | 11/1999 |
| WO | 0001067 A2 | 1/2000 |
| WO | 0225842 A2 | 3/2002 |
| WO | 02061330 A2 | 8/2002 |
| WO | 02069306 A2 | 9/2002 |
| WO | 02091805 A2 | 11/2002 |
| WO | 02098182 A2 | 12/2002 |
| WO | 02099780 A2 | 12/2002 |
| WO | 03026358 A1 | 3/2003 |
| WO | 03055273 A2 | 7/2003 |
| WO | 03067934 A2 | 8/2003 |
| WO | 03090890 A1 | 11/2003 |
| WO | 03096761 A1 | 11/2003 |
| WO | 2004021747 A2 | 3/2004 |
| WO | 2004023850 A2 | 3/2004 |
| WO | 2004032572 A2 | 4/2004 |
| WO | 2004057924 | 7/2004 |
| WO | 2004100624 A2 | 11/2004 |
| WO | 2005031860 A2 | 4/2005 |
| WO | 2005052751 A2 | 6/2005 |
| WO | 2005060309 A2 | 6/2005 |
| WO | 2005084339 A2 | 9/2005 |
| WO | 2005089293 A2 | 9/2005 |
| WO | 2005089309 A2 | 9/2005 |
| WO | 2006023149 A2 | 3/2006 |
| WO | 2006044328 A1 | 4/2006 |
| WO | 2006056120 A1 | 6/2006 |
| WO | 2006093889 A2 | 9/2006 |
| WO | 2006127666 A2 | 11/2006 |
| WO | 2006127785 A2 | 11/2006 |
| WO | 2006133272 A2 | 12/2006 |
| WO | 2006137686 A1 | 12/2006 |
| WO | 2007004679 A1 | 1/2007 |
| WO | 2007081674 A1 | 7/2007 |
| WO | 2007090292 A1 | 8/2007 |
| WO | 2007094810 A2 | 8/2007 |
| WO | 2008061991 A1 | 5/2008 |
| WO | 2008110978 A1 | 9/2008 |
| WO | 2008137460 A2 | 11/2008 |
| WO | 2009067074 A1 | 5/2009 |
| WO | 2009111978 A1 | 9/2009 |
| WO | 2009143047 A1 | 11/2009 |
| WO | 2010014437 A2 | 2/2010 |
| WO | 2010030509 A2 | 3/2010 |
| WO | 2010047896 A3 | 4/2010 |
| WO | 2010047898 A3 | 4/2010 |
| WO | 2010047973 A3 | 4/2010 |
| WO | 2010069983 A1 | 6/2010 |
| WO | 2010083370 A2 | 7/2010 |
| WO | 2010088105 A2 | 8/2010 |
| WO | 2010132625 A2 | 11/2010 |
| WO | 2010141537 A2 | 12/2010 |
| WO | 2011005579 A2 | 1/2011 |
| WO | 2011072308 A1 | 6/2011 |
| WO | 2011113709 A1 | 9/2011 |
| WO | 2011117059 A1 | 9/2011 |
| WO | 2012004708 A2 | 1/2012 |
| WO | 2012025626 A1 | 3/2012 |
| WO | 2012063174 A2 | 5/2012 |
| WO | 2012117018 A1 | 9/2012 |
| WO | 2012129301 A1 | 9/2012 |
| WO | 2012131522 A1 | 10/2012 |
| WO | 2012131547 A1 | 10/2012 |

OTHER PUBLICATIONS

International Search Report and Written Opinion dated Jan. 4, 2010 from the corresponding International Application No. PCT/US2009/044313 filed May 18, 2009.

(56) References Cited

OTHER PUBLICATIONS

International Search Report and Written Opinion dated Feb. 7, 2011 from the corresponding International Application No. PCT/US2010/039678 filed Jun. 23, 2010.
International Search Report and Written Opinion dated May 7, 2010 from the corresponding International Application No. PCT/US2009/057109 filed on Sep. 16, 2009.
International Search Report and Written Opinion dated Apr. 8, 2010 from the corresponding International Application No. PCT/2009/055114 filed on Aug. 27, 2009.
International Search Report and Written Opinion dated Feb. 8, 2011 from the corresponding International Application No. PCT/US2010/039608 filed Jun. 23, 2010.
International Search Report and Written Opinion dated Dec. 13, 2010 from the corresponding International Application No. PCT/US2010/037006 filed Jun. 2, 2010.
International Search Report and Written Opinion dated Mar. 13, 2012 from the corresponding International Application No. PCT/US2011/052995 filed on Sep. 23, 2011.
International Search Report and Written Opinion dated May 14, 2010 from the corresponding International Application No. PCT/US2009/060085 filed Oct. 9, 2009.
International Search Report and Written Opinion dated Aug. 16, 2010 from the corresponding International Application No. PCT/US2010/021131 filed on Jan. 15, 2010.
International Search Report and Written Opinion dated Jul. 16, 2009 from the corresponding International Application No. PCT/US2008/084650 filed Nov. 25, 2008.
International Search Report and Written Opinion dated Aug. 17, 2010 from the corresponding International Application No. PCT/US2010/021489 filed on Jan. 20, 2010.
International Search Report and Written Opinion dated Jul. 17, 2009 from the corresponding International Application No. PCT/US2008/085118 filed Dec. 1, 2008.
International Search Report and Written Opinion dated Nov. 21, 2011 from the corresponding International Application No. PCT/US2011/029932 filed on Mar. 25, 2011.
International Search Report and Written Opinion dated Mar. 22, 2010 from the corresponding International Application No. PCT/US2009/053853 filed Aug. 14, 2009.
International Search Report and Written Opinion dated Nov. 23, 2011 from the corresponding International Application No. PCT/US2011/042761 filed on Jul. 1, 2011.
International Search Report and Written Opinion dated Nov. 23, 2011 from the corresponding International Application No. PCT/US2011/042775 filed on Jul. 1, 2011.
International Search Report and Written Opinion dated Dec. 24, 2010 from the corresponding International Application No. PCT/US2010/034635 filed May 13, 2010.
International Search Report and Written Opinion dated May 24, 2010 from the corresponding International Application No. PCT/2009/060083 filed Oct. 9, 2009.
International Search Report and Written Opinion dated May 24, 2010 from the corresponding International Application No. PCT/US2009/060087 filed Oct. 9, 2009.
International Search Report and Written Opinion dated Aug. 25, 2009 from corresponding International Application No. PCT/US2009/031049 filed Jan. 15, 2009.
International Search Report and Written Opinion dated Jan. 25, 2010 from the corresponding International Application No. PCT/US2009/048623 filed Jun. 25, 2009.
International Search Report and Written Opinion dated Feb. 26, 2010 from the corresponding International Application No. PCT/US2009/050949 filed Jul. 17, 2009.
International Search Report and Written Opinion dated Apr. 30, 2010 from the corresponding International Application No. PCT/US2009/057072 filed on Sep. 16, 2009.
International Search Report and Written Opinion dated Jul. 30, 2010 from the corresponding International Application No. PCT/US2010/021448 filed on Jan. 20, 2010.
International Search Report and Written Opinion dated Sep. 30, 2011 from the corresponding International Application No. PCT/US2011/029905 filed on Mar. 25, 2011.
International Search Report and Written Opinion dated Feb. 6, 2012 from the corresponding International Application No. PCT/US2011/043524 filed on Jul. 11, 2011.
Best Practice Guide—Commercial Office Buildings—Central HVAC System. [online], [Retrieved on Jan. 17, 2008] Retrieved from FlexYour Power Organization web page using Internet <URL: http://www.fypower.org/bpg/module.html?b=offices&m+Central HVAC Systems&s=Contr . . . >.
Wolsey, Robert. Interoperable Systems: The Future of Lighting Control, Lighting Research Center, Jan. 1, 1997, vol. 2 No. 2, Rensselaer Polytechnic Institute, Troy, New York [online]. Retrieved Lighting Research Center Web Page using Internet <URL: http://www.lrc.rpi.edu/programs/Futures/LF-BAS/index.asp>.
Airport International. Fly High With Intelligent Airport Building and Security Solutions [online], [retrieved on Oct. 24, 2008]. Retrieved from Airport International web page using Internet <URL: http://www.airport-int.com/categories/airport-building-and-security-solutions/fly-high-with-intelligent-airport-building-and-security-solutions.html>.
Cornell University. Light Canopy—Cornell University Solar Decathlon, [online], [retrieved on Jan. 17, 2008] Retrieved from Cornell University web page using Internet <URL: http://cusd.cornell.edu/cusd/web/index.php/page/show/section/Design/page/controls>.
D.N.A.-III, [online], [retrieved Mar. 10, 2009] Retrieved from the PLC Lighting Web Page using Internet <URL: http://www.plclighting.com/product_info.php?cPath=1&products_id=92>.
E20112-22 Starburst Collection, [online], [retrieved on Jul. 10, 2010] Retrieved from ET2 Contemporary Lighting using Internet <URL: http://www.et2online.com/proddetail.aspx?ItemID=E20112-22>.
E20116-18 Larmes Collection, [online], [retrieved on Jul. 10, 2010] Retrieved from ET2 Contemporary Lighting using Internet <URL: http://www.et2online.com/proddetail.aspx?ItemID=E20116-18>.
E20524-10 & E20525-10 Curva Collection, [online], [retrieved on Jul. 10, 2010] Retrieved from ET2 Contemporary Lighting using Internet <URL: http://www.et2online.com/proddetail.aspx?ItemID=E20524-10 & E20525-10>.
E20743-09 Stealth Collection, [online], [retrieved on Jul. 10, 2010] Retrieved from ET2 Contemporary Lighting using Internet <URL: http://www.et2online.com/proddetail.aspx?ItemID=E20743-09>.
E22201-44 Esprit Collection, [online], [retrieved on Jul. 10, 2010] Retrieved from ET2 Contemporary Lighting using Internet <URL: http://www.et2online.com/proddetail.aspx?ItemID=E22201-44>.
Extended European Search Report for co-pending European Application No. 10 73 2124 mailed on Dec. 13, 2012 in 8 pages.
Extended European Search Report for co-pending European Application No. 09822425.6 mailed on Aug. 30, 2012 in 9 pages.
Extended European Search Report for co-pending European Application No. 10736237.8 mailed on Oct. 19, 2012 in 5 pages.
Extended European Search Report for Co-pending European Application No. 10738925.6 mailed on Oct. 1, 2012 in 7 pages.
Examination and Search Report mailed on Jul. 2, 2012 in cooresponding United Kingdom Application No. 10018896.9 in 4 pages.
Experiment Electronic Ballast. Electronic Ballast for Fluorescent Lamps [online], Revised Fall of 2007. [Retrieved on Sep. 1, 1997]. Retrieved from Virginia Tech Web Page using Internet <URL: http://www.ece.vt.edu/ece3354/labs/ballast.pdf.>.
Henson, Keith. The Benefits of Building Systems Integration, Access Control & Security Systems Integration, Oct. 1, 2000, Penton Media. [online], [retrieved on Oct. 24, 2008] Retrieved from Security Solutions Web page using Internet <URL: http://securitysolutions.com/mag/security_benefits_building_systems/>.
Lawrence Berkeley National Laboratory. Lighting Control System—Phase Cut Carrier. University of California, [online] [retrieved on Jan. 14, 2008] Retrieved from Lawrence Berkeley National Labratory web page using Internet <URL: http://www.lbl.gov/tt/techs/lbnl1871.html>.

(56) References Cited

OTHER PUBLICATIONS

LCD Optics 101 Tutorial [online]. 3M Corporation, [retrieved on Jan. 6, 2010]. Retrieved from the internet: <URL: http://solutions.3m.com/wps/portal/3M/en_US/Vikuiti1/BrandProducts/secondary/optics101/>.
LED Lights, Replacement LED lamps for any incandescent light, [online], [retrieved on Jan. 13, 2000] Retrieved from LED Lights Web Page using Internet <URL: http://www.ledlights.com/replac.htm>.
Ledtronics, Ledtronics Catalog, 1996, p. 10, Ledtronics, Torrance, California.
Phason Electronic Control Systems, Light Level Controller (LLC) case study. Nov. 30, 2004. 3 pages, Phason Inc., Winnipeg, Manitoba, Canada.
Philips. Sense and Simplicity—Licensing program for LED Luminaires and Retrofits, Philips Intellectual Property & Standards, May 5, 2009.
Piper. The Best Path to Efficiency. Building Operating Management, Trade Press Publishing Company May 2000 [online], [retrieved on Jan. 17, 2008]. Retrieved from Find Articles Web Page using Internet <URL:http://findarticles.com/p/articles/mi_qu3922/is_200005/ai_n8899499/>.
PLC-81756-AL "Fireball" Contemporary Pendant Light, [online], [retrieved on Feb. 27, 2009] Retrieved from the Arcadian Lighting Web Page using Internet <URL: http://www.arcadianlighting.com/plc-81756-al.html>.
PLC-96973-PC PLC Lighting Elegance Modern/Contemporary Pendant Light, [online], [retrieved on Feb. 27, 2009] Retrieved from the Arcadian Lighting Web Page using Internet <URL: http/www.arcadianlighting.com/plc-96978-pc.html>.
Sensor Switch, nLight Lighting Control System, [online], [retrieved on Jan. 11, 2008] Retrieved from Sensor Switch web page using Internet <URL: http://www.sensorswitch.com>.
Six Strategies, [online], [retrieved on Jan. 11, 2008] Retrieved from Encelium Technologies Inc. Web Page using Internet <URL: http://www.encelium.com/products/strategies.html>.
Spencer, Eugene. High Sales, Low Utilization. Green Intelligent Buildings, Feb. 1, 2007. [online]. Retrieved from Green Intelligent Buildings web page using Internet <URL: http://www.greenintelligentbuildings.com/CDA/IBT_Archive/BNP_GUID_9-5-2006_A_10000000000000056772>.
Supplementary European Search Report dated Feb. 29, 2012 from European Patent Application No. 09822424.9.
Telecite Products & Services—Display Options, [online], [retrieved on Jan. 13, 2000] Retrieved from Telecite Web page using Internet <URL: http://www.telecite.com/en/products/options en.htm>.
Traffic Signal Products—Transportation Products Group, [online], [retrieved on Jan. 13, 2000] Retrieved from the Dialight Web Page using Internet <URL: http://www.dialight.com/trans.htm>.
Truck-Lite, LEDSelect—LED, Model 35, Clearance & Marker Lighting, [online], [retrieved on Jan. 13, 2000] Retrieved from Truck-Lite Web Page using Internet <URL: http://trucklite.com/leds14.html>.
Truck-Lite, LEDSelect—LED, Model 45, Stop, Turn & Tail Lighting [online], [retrieved on Jan. 13, 2000] Retrieved from Truck-Lite Web Page using Internet <URL: http://trucklite.com/leds4.html>.
Truck-Lite, LEDSelect—LED, Super 44, Stop, Turn & Tail Lighting, [online], [retrieved on Jan. 13, 2000] Retrieved from Truck-Lite Web Page using Internet <URL: http://trucklite.com/leds2.html>.
International Search Report and Written Opinion dated Feb. 15, 2013 from the corresponding International Application No. PCT/US22012/052244 filed on Aug. 24, 2012.

* cited by examiner

CIRCUIT BOARD MOUNT FOR LED LIGHT

CROSS-REFERENCE TO RELATED APPLICATIONS

This application claims priority to U.S. Provisional Application No. 61/526,875, filed Aug. 24, 2011, which is hereby incorporated by reference in its entirety.

FIELD OF THE INVENTION

The present invention relates in general to a light emitting diode (LED) based light, and in particular to a method and apparatus for mounting circuit boards in the LED light.

BACKGROUND

Fluorescent tube lights are widely used in a variety of locations, such as schools and office buildings. Although conventional fluorescent bulbs have certain advantages over, for example, incandescent lights, they also pose certain disadvantages including, inter alia, disposal problems due to the presence of toxic materials within the glass tube.

LED-based lights which can be used as one-for-one replacements for fluorescent tube lights have appeared in recent years. LED-based lights can be constructed with LEDs and other circuitry mounted on one or more circuit boards. LED-based lights can include a housing and a heat sink to dissipate heat produced by the LEDs contained therein. In some cases, the circuit board containing the LEDs is functionally attached to the heat sink or housing to prevent the circuit board from moving out of place. In some instances, these attachments may not be adequate.

SUMMARY

Embodiments of an LED-based light for replacing a conventional fluorescent light in an existing fixture are disclosed herein. In one such embodiment, the LED-based light includes an elongated housing and a heat sink extending substantially the length of the housing. The heat sink has at least one integral retaining portion. The LED-based light also includes a circuit board positioned on the heat sink and having a plurality of LEDs mounted thereon. The at least one integral retaining portion is configured to secure the circuit board to the heat sink.

Embodiments of a method of manufacturing an LED-based light are also disclosed herein. In one such embodiment, the method includes providing a heat sink having a longitudinally extending flat surface and at least one integral retaining portion extending away from the flat surface in an unengaged position and positioning a circuit board on the flat surface of the heat sink. The method also includes mounting a plurality of LEDs on the circuit board and engaging at least a portion of the at least one integral retaining portion of the heat sink to the circuit board such that the circuit board is secured to the heat sink.

These and other embodiments will be described in additional detail hereafter.

BRIEF DESCRIPTION OF THE DRAWINGS

The description herein makes reference to the accompanying drawings wherein like reference numerals refer to like parts throughout the several views, and wherein.

DETAILED DESCRIPTION

Attaching the circuit board to the heat sink using screws, glue, tape, heat stakes, clips, or other types of fasteners can be both expensive and inadequate over time due to constant temperature changes affecting the attachments. Using one of these various attaching techniques can also reduce the effectiveness of a heat sink or disturb the functioning of the circuit board.

Embodiments disclosed herein can simplify the design of LED-based lights by combining the heat sink function and the circuit board attachment function which can reduce cost and manufacturing assembly time and increase heat sink effectiveness. By engaging an integral retaining portion on the heat sink to the circuit board or other support, the circuit board can be held in place. Integral retaining portions of the heat sink can be engaged to the circuit board by crimping the integral retaining portions, for example walls or fins, on to the heat sink to overlap or extend over the circuit board and hold the circuit board in position against the heat sink.

Figure 1:
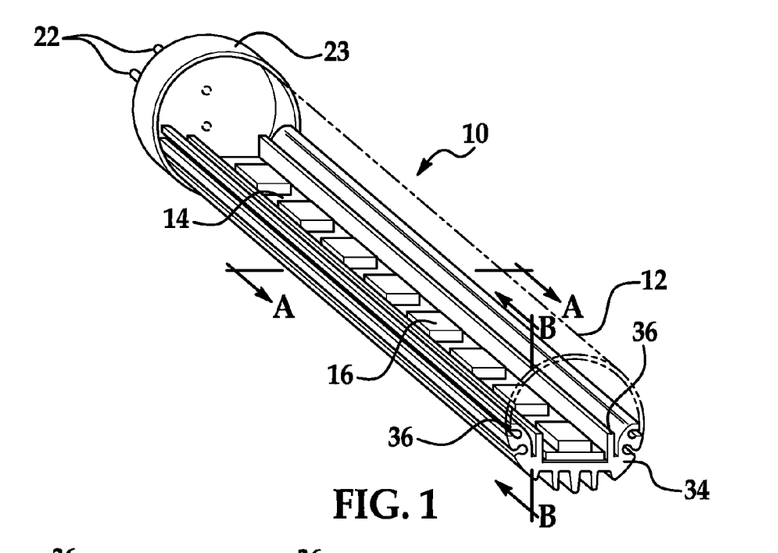
FIG. 1 is a perspective view of an LED-based light with disengaged heat sink integral retaining portions in accordance with one embodiment.

FIG. 1 illustrates an LED-based light 10 including a housing 12 with open ends, a heat sink 34, a circuit board 14 positioned on the heat sink 34, LEDs 16 mounted on the circuit board 14, and a pair of end caps 23 (only one illustrated in FIG. 1) on opposite ends of the housing 12. At least one of the end caps 23 can carry at least one connector 22 to electrically connect the LEDs 16 to an existing fixture. Each end cap 23 can include two pins, though two of the total four pins can be "dummy pins" that do not provide an electrical connection. Alternatively, other types of end caps can be used, such as single pin end caps. Also, while the end caps 23 is shown as including a cup-shaped body, the end caps can have a different configuration (e.g., the end caps can be shaped to be press fit into the housing 12).

The heat sink 34 has a flat surface extending longitudinally the length of the heat sink 34 with projections/integral retaining portions 36 such as walls or fins extending away (e.g., vertically) from opposite sides of the flat surface of the heat sink 34 in an unengaged position. The integral retaining portions may also extend in a different direction than vertically (e.g., extend outwardly from the heat sink).

In the embodiment illustrated in FIG. 1, the integral retaining portions also extend the length of the heat sink. In other embodiments, the integral retaining portions may extend less than the full length of the heat sink. As shown, there are integral retaining portions on each side of the circuit board. In some embodiments, there may only be one integral retaining portion on one side of the circuit board. In other embodiments, there may be multiple distinct integral retaining portions along the length of the heat sink 34. If there are multiple integral retaining portions, each may be distributed evenly along the length of the heat sink. In other embodiments the distribution may be uneven. In some embodiments, there may only be integral retaining portions on each side and each end of the heat sink 34. Any suitable number and configuration of integral retaining portions may be used to suitably secure the circuit board to the heat sink 34.

In this embodiment of an LED-based light 10, before assembly is completed, the integral retaining portions 36 on the heat sink 34 are not engaged with the circuit board 14 (i.e., in an unengaged position). The heat sink 34 in FIG. 1 shows an example of how the integral retaining portions 36 can be structured before being engaged to the circuit board 14. In addition to engaging the integral retaining portions 36 to the circuit board 14 as described in embodiments herein, the circuit board 14 of FIG. 1 can be fastened to the heat sink 34 with screws, glue, heat stakes, or other structures so that circuit board 14 does not shift in location on the heat sink 34.

Figure 2:
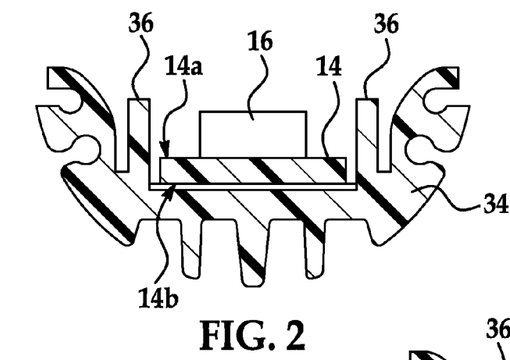
FIG. 2 is cross-section view of the LED-based light of FIG. 1 along line A-A.

FIG. 2 shows a cross-section of FIG. 1 at line A-A. In one embodiment, the heat sink 34 is a segment of thermally conductive metal of at least the same width as or wider than the circuit board 14 for dissipating heat generated by the LEDs 16 to the ambient environment. The heat sink 34, before assembly, also has integral retaining portions 36 in the form of walls or fins that rise above the thickness of the circuit board 14. The circuit board 14 has an LED-mounting side 14a and a primary heat transferring side 14b opposite the LED-mounting side 14a. The heat sink 34 can be designed so that the space between the integral retaining portions 36 on the heat sink 34 is roughly the width of the circuit board 14 so that the circuit board 14 fits between the integral retaining portions 36 on the heat sink 34 with little room for lateral movement. In another embodiment, the circuit board 14 can be designed so that it fits between the integral retaining portions 36 on the heat sink 34 with ample room for lateral movement. The placement of the circuit board 14 on the heat sink 34 can facilitate the integral retaining portions 36 engaging the circuit board 14.

Figure 3:
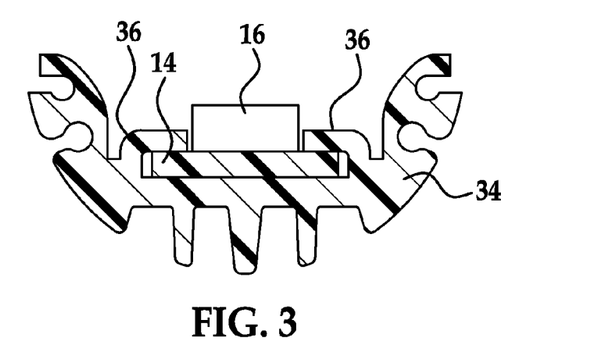
FIG. 3 is cross-section view of an LED-based light with engaged heat sink integral retaining portions in accordance with another embodiment along a line similar to line A-A in FIG. 1.

Once the circuit board 14 is placed of the top flat surface of the heat sink 34 as shown in FIG. 2, the integral retaining portions 36 on the heat sink 34 can be engaged to the LED-mounting side 14a of the circuit board 14 as shown in FIG. 3. Engaging the integral retaining portions 36 of the heat sink 34 to the circuit board 14 can, for example, be accomplished by crimping the integral retaining portions 36 manually with any suitable artifact, e.g. with pliers, or can be done automatically by any known machine process, for example, pneumatic crimping.

Figure 5:
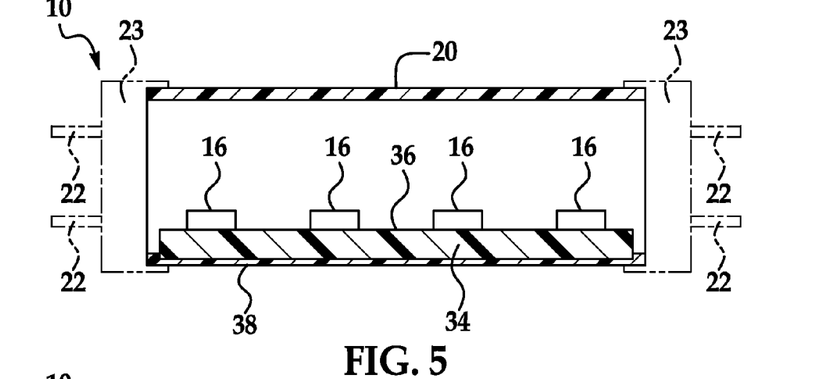
FIG. 5 is a cross-section view of the LED-based light of FIG. 4 along a line similar to line B-B in FIG. 1.
Figure 6:
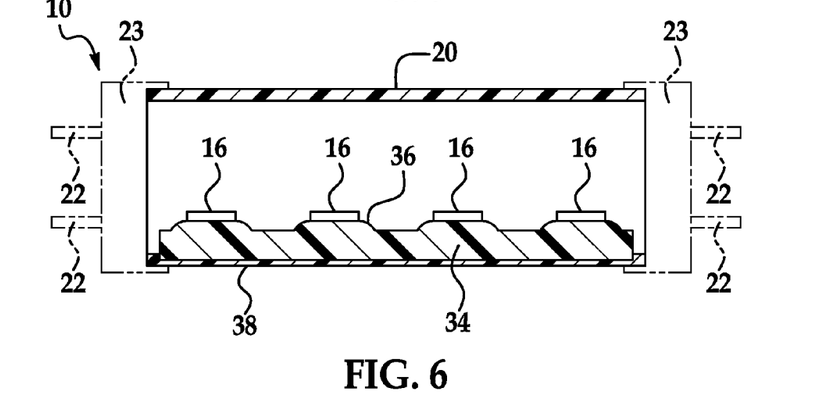
FIG. 6 is a cross-section view of an LED-based light with intermittently engaged heat sink integral retaining portions in accordance with another embodiment along a line similar to line B-B in FIG. 1.

Further, the engagement, for example crimping, can be performed along the entire length of the heat sink 34 as shown in FIG. 5 or at selected locations along the length of the heat sink 34 as shown in FIG. 6. It is not necessary to engage the entire length of integral retaining portions 36 to the circuit board 14, only enough engagement to keep the circuit board 14 from shifting. FIGS. 5 and 6 give two examples of how integral retaining portions 36 extending vertically from each side of the top flat surface of the heat sink 34 can be engaged to the LED-mounting side 14a of the circuit board 14. FIG. 5 illustrates that a single integral retaining portion 36 on each side of the heat sink 34 is crimped for the full length of the circuit board 14. FIG. 6 illustrates that a single integral retaining portion 36 on each side of the heat sink 34 is crimped at multiple locations along the circuit board 14, in this case, between the spaced LEDs 16. For example, the integral retaining portions 36 on the heat sink 34 shown in FIGS. 5 and 6 can each be 3 mm high making it possible to crimp the integral retaining portions 36 to the circuit board 14 manually with pliers. Other dimensions of integral retaining portions 36 or number of integral retaining portions 36 can be engaged to the circuit board 14.

Figure 4:
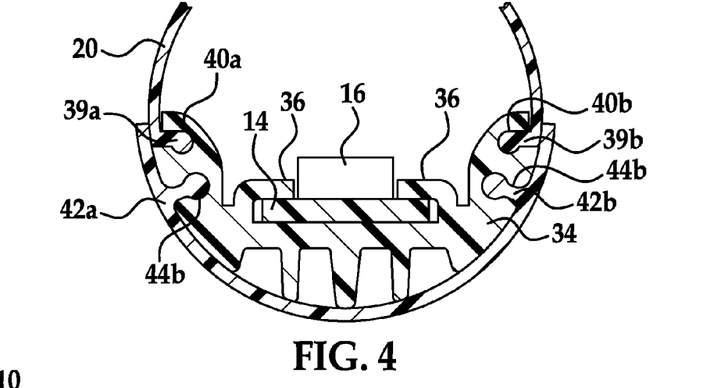
FIG. 4 is a cross-section view of an LED-based light in accordance with another embodiment along a line similar to line A-A in FIG. 1.

FIG. 4 illustrates a cross-section of an embodiment of an LED-based light 10 similar to the embodiment of FIG. 1 at a line similar to line A-A with a portion of the housing 12 comprised of a lens 20 engaged to the heat sink 34. In this embodiment, the lens 20 includes at two rounded-end integral retaining portions 39a and 39b on an interior surface that each engage a groove 40a and 40b, respectively on an outer surface of the heat sink 34. The lens 20 can be made from polycarbonate, acrylic, glass, or another high-dielectric light transmitting material. The lens 20 can include light diffracting structures, such as dots, bumps, dimples, and other uneven surfaces formed on the interior or exterior of the lens 20. A light diffracting film can be applied to the exterior of the lens 20 or placed between the lens 20 and heat sink 34. The lens 20 can be formed of a material including light diffusing particles. The term "lens" as used herein means a light transmitting structure, and not necessarily a structure for concentrating or diverging light.

The LED-based light 10 of FIG. 4 also includes a cover 38 engaged to the heat sink 34 and forming a portion of the housing 12. In this embodiment, the cover 38 includes at least one rounded-end integral retaining portion 42a and 42b on an interior surface that each engages a groove 44a and 44b on an outer surface of the heat sink 34. Providing the cover 38 can allow the use of a highly thermally and electrically conductive heat sink 34, e.g., an extruded aluminum heat sink 34, because the dielectric properties of the cover 38 can reduce the shock hazard potential of capacitive coupling between the circuit board 14 and the heat sink 34. Additionally, the cover 38 can provide structural support to the LED-based light 10. Alternative forms of attachment of the lens 20 or cover 38 to the heat sink 34, such as screws, highly thermally conductive adhesive tape, friction fit, or other attachments known to those of skill in the art are alternatively usable.

Other suitable embodiments of LED-based light 10 including integral retaining portions 36 are also available. For example, although the integral retaining portions 36 are shown to extend the length of the heat sink 34, one or more integral retaining portions may be included in the LED-based light 10 on one or both sides of the heat sink. For example, the LED-based light 10 may include a total of four projections that are a fraction of the length of the tube and are only located at each longitudinal end the heat sink 34. Each projection can be, as discussed previously, structured so that it engages the circuit board to keep it in place.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. An LED-based light for replacing a conventional fluorescent light in a light fixture comprising:
   an elongated housing;
   a heat sink extending substantially the length of the housing and having a substantially flat first surface and at least one integral retaining portion; and
   a circuit board having a first side and an opposing second side having a plurality of LEDs mounted thereon, the circuit board positioned on the heat sink with substantially all of the first side overlying the first surface of the heat sink, wherein the at least one integral retaining portion is crimped to the circuit board to engage the first side with the first surface of the heat sink and secure the circuit board to the heat sink.

2. The LED-based light of claim 1, wherein the at least one integral retaining portion extends over and is crimped to the second side of the circuit board.

3. The LED-based light of claim 1, wherein the at least one integral retaining portion extends substantially the length of the heat sink.

4. The LED-based light of claim 3, wherein the at least one integral retaining portion is crimped to the circuit board along substantially the length of the heat sink or at a plurality of distinct locations along the length of the heat sink.

5. The LED-based light of claim 1, wherein the at least one integral retaining portion includes a plurality of integral retaining portions crimped to the heat sink and wherein the plurality of integral retaining portions are substantially evenly spaced along the length of the heat sink.

6. The LED-based light of claim 1, wherein the at least one integral retaining portion includes first and second integral retaining portions outboard of the first surface and extending substantially the length of the heat sink and wherein the circuit board is positioned on the heat sink between the first and second integral retaining portions.

7. The LED-based light of claim 6, wherein the first and second retaining portions are each crimped to the circuit board along substantially the length of the heat sink.

8. The LED-based light of claim 6, wherein the first and second retaining portions are each crimped to the circuit board at a plurality of distinct locations along the length of the heat sink.

9. The LED-based light of claim 1, further comprising:
a pair of end caps disposed on opposite ends of the housing.

10. The LED-based light of claim 1 wherein the housing is tubular and substantially all of the heat sink and circuit board are disposed within the housing.

11. A method of manufacturing an LED-based light comprising:
positioning the first of two opposing sides of a circuit board including at least one LED onto a substantially flat first surface of an elongate heat sink having an integral retaining portion such that substantially all of the first side of the circuit board overlies the first surface of the heat sink; and
crimping the retaining portion into engagement with the circuit board to engage the first side of the circuit board with the first surface of the heat sink and fix the position of the circuit board on the first surface of the heat sink.

12. The method of claim 11, further comprising
attaching a lens including a light transmitting portion to the heat sink, with the light transmitting portion at least partially enclosing the at least one LED, to at least partially complete a housing for the LED-based light; and
attaching a connector configured for engagement with a light fixture to the housing.

13. The method of claim 11, wherein crimping the retaining portion further comprises crimping the retaining portion into engagement with the circuit board along substantially the length of the heat sink.

14. The method of claim 11, wherein crimping the retaining portion further comprises crimping the retaining portion into engagement with the circuit board at a plurality of distinct locations along the length of the heat sink.

15. The method of claim 11, wherein the heat sink has a plurality of integral retaining portions substantially evenly spaced along the length of the heat sink, and wherein crimping the retaining portion further comprises crimping each of the plurality of integral retaining portions into engagement with the circuit board.

16. An LED-based light comprising:
a circuit board having a first side and an opposing second side;
at least one LED mounted on the second side of the circuit board;
a heat sink for the at least one LED, the heat sink defining a substantially flat first surface and a heat dissipating area opposite the first surface, the circuit board positioned on the heat sink with substantially all of its first side overlying the first surface of the heat sink, the heat sink having at least one integral retaining portion crimped to the circuit board to engage the first side of the circuit board with the first surface of the heat sink and secure the circuit board to the heat sink; and
at least one connector configured for engagement with a light fixture.

17. The LED-based light of claim 16, wherein the at least one integral retaining portion is crimped to the circuit board substantially continuously along the circuit board or at a plurality of distinct locations along the circuit board.

18. The LED-based light of claim 16, wherein the at least one integral retaining portion includes a plurality of evenly spaced integral retaining portions crimped to the circuit board.

19. The LED-based light of claim 16, further comprising:
a lens with a light transmitting portion, the lens attached to the heat sink, with the light transmitting portion at least partially enclosing the at least one LED.

20. The LED-based light of claim 16, further comprising:
an elongate tubular housing for the circuit board, the at least one LED and the heat sink, the housing including a lens with a light transmitting portion at least partially enclosing the at least one LED, wherein the at least one connector includes a pair of bi-pin connectors attached at opposite ends of the housing.

* * * * *